(12) United States Patent
Hwang et al.

(10) Patent No.: US 12,218,156 B2
(45) Date of Patent: Feb. 4, 2025

(54) DISPLAY DEVICE HAVING POWER LINE ELECTRICALLY CONNECTED TO ELECTRODE LAYERS LOCATED ABOVE AND BELOW TRANSISTOR

(71) Applicant: Samsung Display Co., Ltd., Yongin-si (KR)

(72) Inventors: Youngin Hwang, Yongin-si (KR); Elly Gil, Yongin-si (KR); Sungho Kim, Yongin-si (KR); Eungtaek Kim, Yongin-si (KR); Yongho Yang, Yongin-si (KR); Seongmin Wang, Yongin-si (KR); Jina Lee, Yongin-si (KR); Joohyeon Jo, Yongin-si (KR); Seongbaik Chu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/388,594

(22) Filed: Nov. 10, 2023

(65) Prior Publication Data

US 2024/0079419 A1 Mar. 7, 2024

Related U.S. Application Data

(63) Continuation of application No. 17/099,629, filed on Nov. 16, 2020, now Pat. No. 11,855,104, which is a (Continued)

(30) Foreign Application Priority Data

Jun. 29, 2018 (KR) .................. 10-2018-0075937

(51) Int. Cl.
*H01L 27/14* (2006.01)
*G09G 3/3225* (2016.01)
(Continued)

(52) U.S. Cl.
CPC ....... *H01L 27/1255* (2013.01); *G09G 3/3225* (2013.01); *H01L 27/1222* (2013.01);
(Continued)

(58) Field of Classification Search
CPC ............. H01L 27/1255; H01L 27/1222; H01L 27/124; G09G 3/3225; G09G 3/3233;
(Continued)

(56) References Cited

U.S. PATENT DOCUMENTS 7,045,861 B2   5/2006   Takayama et al.
7,622,316 B2   11/2009  Park et al.
(Continued)

FOREIGN PATENT DOCUMENTS

CN    102467876    5/2012
CN    104376813    2/2015
(Continued)

OTHER PUBLICATIONS

Non-Final Office Action dated Jun. 5, 2020, issued to U.S. Appl. No. 16/361,135.
(Continued)

*Primary Examiner* — Tan N Tran
(74) *Attorney, Agent, or Firm* — KILE PARK REED & HOUTTEMAN PLLC

(57) ABSTRACT

A display device includes: a first electrode layer; a semiconductor layer including a source region, a drain region, and a channel region, wherein at least a portion of the source region or the drain region overlaps the first electrode layer; a second electrode layer arranged adjacent to the channel region; a third electrode layer overlapping the second electrode layer and at least a portion of the source region or the drain region; and a power line electrically connected to the first electrode layer and the third electrode layer.

20 Claims, 19 Drawing Sheets

Related U.S. Application Data continuation of application No. 16/361,135, filed on Mar. 21, 2019, now Pat. No. 10,903,250.

(51) Int. Cl.
  *H01L 27/12* (2006.01)
  *H10K 59/121* (2023.01)
  *H10K 59/131* (2023.01)

(52) U.S. Cl.
  CPC ....... *H01L 27/124* (2013.01); *H10K 59/1213* (2023.02); *H10K 59/1216* (2023.02); *H10K 59/131* (2023.02)

(58) Field of Classification Search
  CPC ... G09G 2300/0819; G09G 2300/0852; G09G 2300/0861; G09G 2320/0233; G09G 2320/0242; G09G 3/3208; G09G 3/3266; H10K 59/1213; H10K 59/1216; H10K 59/131
  USPC .................................................. 257/59, 72
  See application file for complete search history.

(56) References Cited

U.S. PATENT DOCUMENTS

| | | | |
|---|---|---|---|
| 7,759,863 | B2 | 7/2010 | Kim et al. |
| 7,790,526 | B2* | 9/2010 | Tseng ................. H01L 27/1255 |
| | | | 438/153 |
| 8,497,514 | B2 | 7/2013 | Park et al. |
| 10,050,097 | B2 | 8/2018 | Oh et al. |
| 10,297,784 | B2* | 5/2019 | Matsueda ............ H10K 77/111 |
| 10,566,402 | B2 | 2/2020 | Cho et al. |
| 10,720,558 | B2 | 7/2020 | Moon et al. |
| 2007/0114530 | A1 | 5/2007 | Kimura |
| 2007/0210303 | A1 | 9/2007 | Ikeda et al. |
| 2008/0118743 | A1 | 5/2008 | Lee et al. |
| 2012/0010541 | A1 | 5/2012 | Choi et al. |
| 2012/0105410 | A1 | 5/2012 | Choi et al. |
| 2014/0034923 | A1 | 2/2014 | Kim et al. |
| 2015/0014489 | A1 | 5/2015 | Chang et al. |
| 2015/0144892 | A1 | 5/2015 | Chang et al. |
| 2015/0020692 | A1 | 7/2015 | Sato |
| 2015/0206929 | A1 | 7/2015 | Sato |
| 2015/0037992 | A1 | 12/2015 | Lee et al. |
| 2015/0379923 | A1 | 12/2015 | Lee et al. |
| 2016/0133191 | A1 | 1/2016 | Wang et al. |
| 2016/0014135 | A1 | 5/2016 | You |
| 2016/0141344 | A1 | 5/2016 | Sato |
| 2016/0141351 | A1 | 5/2016 | You |
| 2017/0011685 | A1 | 1/2017 | Park et al. |
| 2017/0005397 | A1 | 2/2017 | Cho et al. |
| 2017/0053975 | A1 | 2/2017 | Cho et al. |
| 2017/0018683 | A1 | 6/2017 | Zhang et al. |
| 2017/0162822 | A1* | 6/2017 | Park ........................ H10K 59/87 |
| 2017/0186832 | A1 | 6/2017 | Zhang et al. |
| 2017/0278916 | A1 | 9/2017 | Maruyama |
| 2018/0026140 | A1 | 1/2018 | Yamazaki |
| 2019/0088200 | A1 | 3/2019 | Woo et al. |

FOREIGN PATENT DOCUMENTS

| | | |
|---|---|---|
| CN | 105609521 | 5/2016 |
| CN | 106469745 | 3/2017 |
| CN | 106935627 | 7/2017 |
| JP | 2001-100655 | 4/2001 |
| JP | 2004-341196 | 12/2004 |
| JP | 2005-115104 | 4/2005 |
| JP | 2007-109868 | 4/2007 |
| KR | 10-2005-0119367 | 12/2005 |
| KR | 10-2007-0121376 | 12/2007 |
| KR | 10-2014-0018623 | 2/2014 |
| KR | 20140018623 | 2/2014 |
| KR | 10-2015-0086188 | 7/2015 |
| KR | 10-2015-0100568 | 9/2015 |
| KR | 10-2016-0001584 | 1/2016 |
| KR | 20160002337 | 1/2016 |
| KR | 10-2016-0140542 | 12/2016 |
| KR | 10-2017-0023271 | 3/2017 |
| KR | 10-2017-0049705 | 5/2017 |
| KR | 10-2017-0080223 | 7/2017 |

OTHER PUBLICATIONS

Notice of Allowance dated Sep. 11, 2020, issued to U.S. Appl. No. 16/361,135.
Notice of Allowance dated Sep. 23, 2020, issued to U.S. Appl No. 16/361,135.
NonFinal Office Action dated Feb. 17, 2022, issued to U.S. Appl. No. 17/099,629.
Final Office Action dated Jul. 14, 2022, issued to U.S. Appl. No. 17/099,629.
Advisory Action dated Sep. 16, 2022, issued to U.S. Appl. No. 17/099,629.
NonFinal Office Action dated Dec. 5, 2022, issued to U.S. Appl. No. 17/099,629.
Final Office Action dated Feb. 24, 2023, issued to U.S. Appl. No. 17/099,629.
Advisory Action dated Apr. 17, 2023, issued to U.S. Appl. No. 17/099,629.
Notice of Allowance dated Aug. 10, 2023, issued to U.S. Appl. No. 17/099,629.
Korean Office Action dated Dec. 21, 2023 in Korean Patent Application No. 2018-0075937 (with English translation).
Korean Office Action dated Dec. 21, 2023 in Korean Patent Application No. 2018-0075937 (with English translation previously submitted).

* cited by examiner

DISPLAY DEVICE HAVING POWER LINE ELECTRICALLY CONNECTED TO ELECTRODE LAYERS LOCATED ABOVE AND BELOW TRANSISTOR

CROSS-REFERENCE TO RELATED APPLICATIONS

This application is a Continuation of U.S. patent application Ser. No. 17/099,629, filed Nov. 16, 2020, now issued as U.S. Pat. No. 11,855,104, which is a Continuation of U.S. patent application Ser. No. 16/361,135, filed Mar. 21, 2019, now issued as U.S. Pat. No. 10,903,250, which claims priority from and the benefit of Korean Patent Application No. 10-2018-0075937, filed Jun. 29, 2018, each of which is hereby incorporated by reference for all purposes as if fully set forth herein.

BACKGROUND

Field

Exemplary implementations of the invention relate generally to a display device and, more particularly, to a display device having a pixel structure capable of compensating for hysteresis.

Discussion of the Background

A display device such as an organic light-emitting display device, a liquid crystal display device, or the like includes an array substrate including a thin-film transistor (TFT), a capacitor, and a plurality of wirings. The array substrate is formed of a fine pattern such as a TFT, a capacitor, and wirings, and the display device is operated by complex connection among the TFT, the capacitor, and the wirings.

Recently, as the demand for compact and high-resolution display devices increases, there is increasing demand for efficient spatial arrangements, connection structures, and driving methods of the TFT, the capacitor, and the wirings included in such display devices, and an improvement in quality of implemented images.

The above information disclosed in this Background section is only for understanding of the background of the inventive concepts, and, therefore, it may contain information that does not constitute prior art.

SUMMARY

Applicant discovered that luminance problems in compact and high resolution display devices, such a color smear, may be caused by hysteresis. Devices constructed according to exemplary implementations of the invention are capable of reducing or preventing color smear phenomenon by compensating for hysteresis. For example, compensation capacitors in the pixel driving circuits of the display may compensate for hysteresis by voltage stabilization.

More specifically, display devices constructed according to exemplary implementations of the invention may include a compensation capacitor having a first electrode that is at least a portion of a source region or a drain region of a driving transistor and a second electrode connected to a power line which receives a first power supply voltage so that an on-bias voltage of the driving transistor may be increased. The on bias voltage of the driving transistor may be further increased by further providing a pair of parallel-connected compensation capacitors.

In addition, display devices constructed according to exemplary implementations of the invention may differentiate the on bias voltage for each color pixel through capacity control by controlling areas (widths) of opposite electrodes of the compensation capacitors. Thus, the on bias voltage may be controlled for each color pixel to adjust the amount of light emission and a point in time of light emission for each color pixel. Therefore, the display device according to the exemplary implementations may reduce the deviation of light emission delay between color pixels, thereby improving color smear and/or color blurring.

Additional aspects will be set forth in part in the description which follows and, in part, will be apparent from the description, or may be learned by practice of the presented exemplary embodiments.

According to one or more exemplary embodiments, a display device includes: a first electrode layer; a semiconductor layer including a source region, a drain region, and a channel region, wherein at least a portion of the source region or the drain region overlaps the first electrode layer; a second electrode layer adjacent to the channel region; a third electrode layer overlapping the second electrode layer and at least a portion of the source region or the drain region; and a power line electrically connected to the first electrode layer and the third electrode layer.

The first electrode layer may overlap the channel region.

The first electrode layer may be disposed on a lower layer of the semiconductor layer, and the third electrode layer may be disposed on an upper layer of the semiconductor layer.

The power line may receive a substantially constant voltage.

The channel region of the semiconductor layer may be curved.

The display device may further include: a first insulating layer disposed between the first electrode layer and the semiconductor layer; a second insulating layer disposed between the semiconductor layer and the second electrode layer; a third insulating layer disposed between the second electrode layer and the third electrode layer; and a fourth insulating layer disposed between the third electrode layer and the power line.

According to one or more exemplary embodiments, a display device includes: a first driving transistor in a first pixel region of a substrate and having a first semiconductor layer and a first gate electrode, wherein the first semiconductor layer includes a first source region, a first drain region, and a first channel region; a second driving transistor in a second pixel region adjacent to the first pixel region of the substrate and having a second semiconductor layer and a second gate electrode, wherein the second semiconductor layer includes a second source region, a second drain region, and a second channel region; a first electrode layer facing at least a portion of the first source region or the first drain region; a second electrode layer facing the first gate electrode and at least a portion of the first source region or the first drain region; a third electrode layer facing at least a portion of the second source region or the second drain region; a fourth electrode layer facing the second gate electrode and at least a portion of the second source region or the second drain region; and a power line electrically connected to the first electrode layer, second electrode layer, third electrode layer, and fourth electrode layer.

An area of the third electrode layer that overlaps the second source region or the second drain region may be greater than an area of the first electrode layer that overlaps the first source region or the first drain region.

An area of the second source region or the second drain region that overlaps the third electrode layer may be greater than an area of the first source region or the first drain region that overlaps the first electrode layer.

An area of the fourth electrode layer that overlaps the second source region or the second drain region may be greater than an area of the second electrode layer that overlaps the first source region or the first drain region.

An area of the fourth electrode layer that overlaps the second source region or the second drain region may be greater than an area of the second electrode layer that overlaps the first source region or the first drain region.

An area of the fourth electrode layer may be greater than an area of the second electrode layer.

The display device may further include: a third driving transistor which may be in a third pixel region adjacent to the second pixel region of the substrate and having a third semiconductor layer and a third gate electrode, wherein the third semiconductor layer may include a third source region, a third drain region, and a third channel region; a fifth electrode layer facing at least a portion of the third source region or the third drain region; and a sixth electrode layer facing the third gate electrode and at least a portion of the third source region or the third drain region, wherein the fifth electrode layer and the sixth electrode layer may be electrically connected to the power line.

An area of the fifth electrode layer that overlaps the third source region or the third drain region may be equal to an area of the first electrode layer that overlaps the first source region or the first drain region.

An area of the fifth electrode layer that overlaps the third source region or the third drain region may be equal to an area of the third electrode layer that overlaps the second source region or the second drain region.

According to one or more exemplary embodiments, a display device includes: a first driving transistor disposed in a first pixel region of the substrate, and including a first driving transistor having a first semiconductor layer and a first gate electrode, a first capacitor and a second capacitor, wherein the first semiconductor layer includes a first source region and a first drain region, the first capacitor includes a first lower electrode and a first upper electrode and the second capacitor includes a second lower electrode and a second upper electrode; and a power line electrically connected to the first upper electrode and the second lower electrode, wherein the first lower electrode and the second upper electrode are portions of the first source region or the first drain region, the first upper electrode is disposed on an upper layer of the first semiconductor layer, and the second lower electrode is disposed on a lower layer of the first semiconductor layer.

The second lower electrode may overlap a channel region of the first semiconductor layer.

The first pixel circuit may further include a third capacitor having a third lower electrode and a third upper electrode, wherein the third upper electrode may be electrically connected to the power line, and the third lower electrode may be a portion of the first gate electrode.

The display device may further include: a second driving transistor which may be disposed in a second pixel region adjacent to the first pixel region of the substrate and may include a second semiconductor layer and a second gate electrode, the second semiconductor layer including a second source region and a second drain region; a second pixel circuit in a second pixel region adjacent to the first pixel region of the substrate, and including a second driving transistor including a second semiconductor layer and a second gate electrode, a fourth capacitor and a fifth capacitor, wherein the second semiconductor layer includes a second source region and a second drain region, the fourth capacitor includes a fourth lower electrode and a fourth upper electrode, and the fifth capacitor includes a fifth lower electrode and a fifth upper electrode, wherein the fourth upper electrode and the fifth lower electrode may be electrically connected to the power line, the fourth lower electrode and the fifth upper electrode may be portions of the second source region or the second drain region, the fourth upper electrode may be disposed on an upper layer of the second semiconductor layer, and the fifth lower electrode may be disposed on a lower layer of the second semiconductor layer.

An area of the fourth lower electrode may be greater than an area of the first lower electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
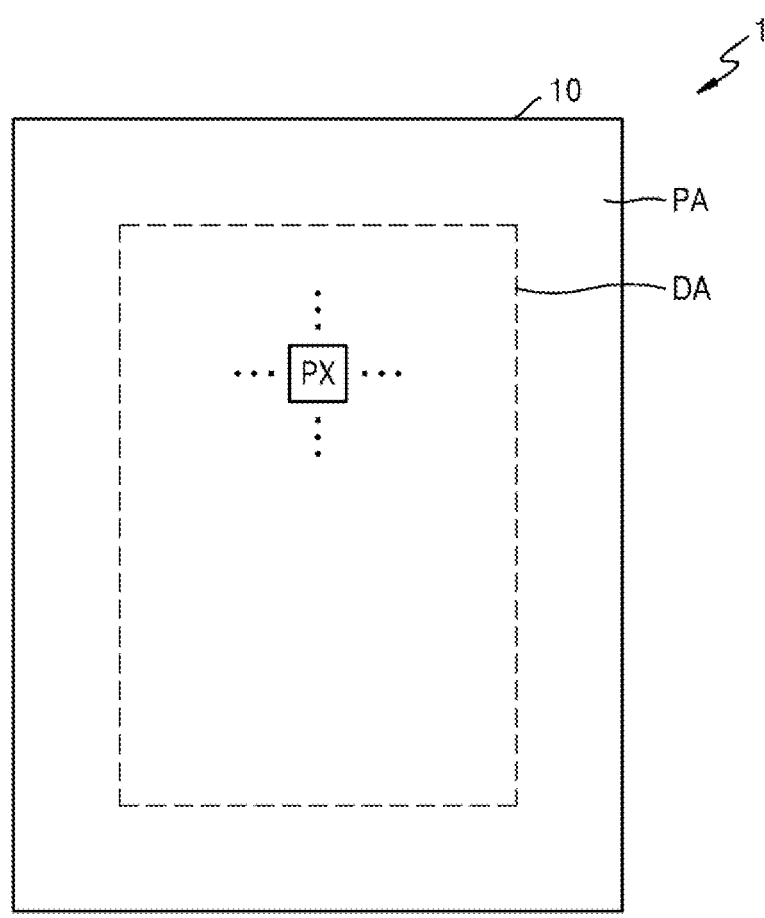
FIG. 1 is a plan view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device 1 constructed according to an exemplary embodiment of the invention.

Referring to FIG. 1, the display device 1 according to an exemplary embodiment includes a substrate 10. The substrate 10 includes a display area DA and a peripheral area PA outside the display area DA.

A plurality of pixels PX may be arranged in the display area DA of the substrate 10. Various wirings for transmitting an electrical signal to be applied to the display area DA may be in the peripheral area PA of the substrate 10.

A pixel PX may include a first sub-pixel that emits a first color, a second sub-pixel that emits a second color, and a third sub-pixel that emits a third color. The sub-pixels may also be referred to herein as "color pixels." The first pixel may be a red pixel, the second pixel may be a green pixel, and the third pixel may be a blue pixel. However, exemplary embodiments are not limited thereto, and the display device 1 may include one or more pixels having sub-pixels emitting different colors.

Figure 2:
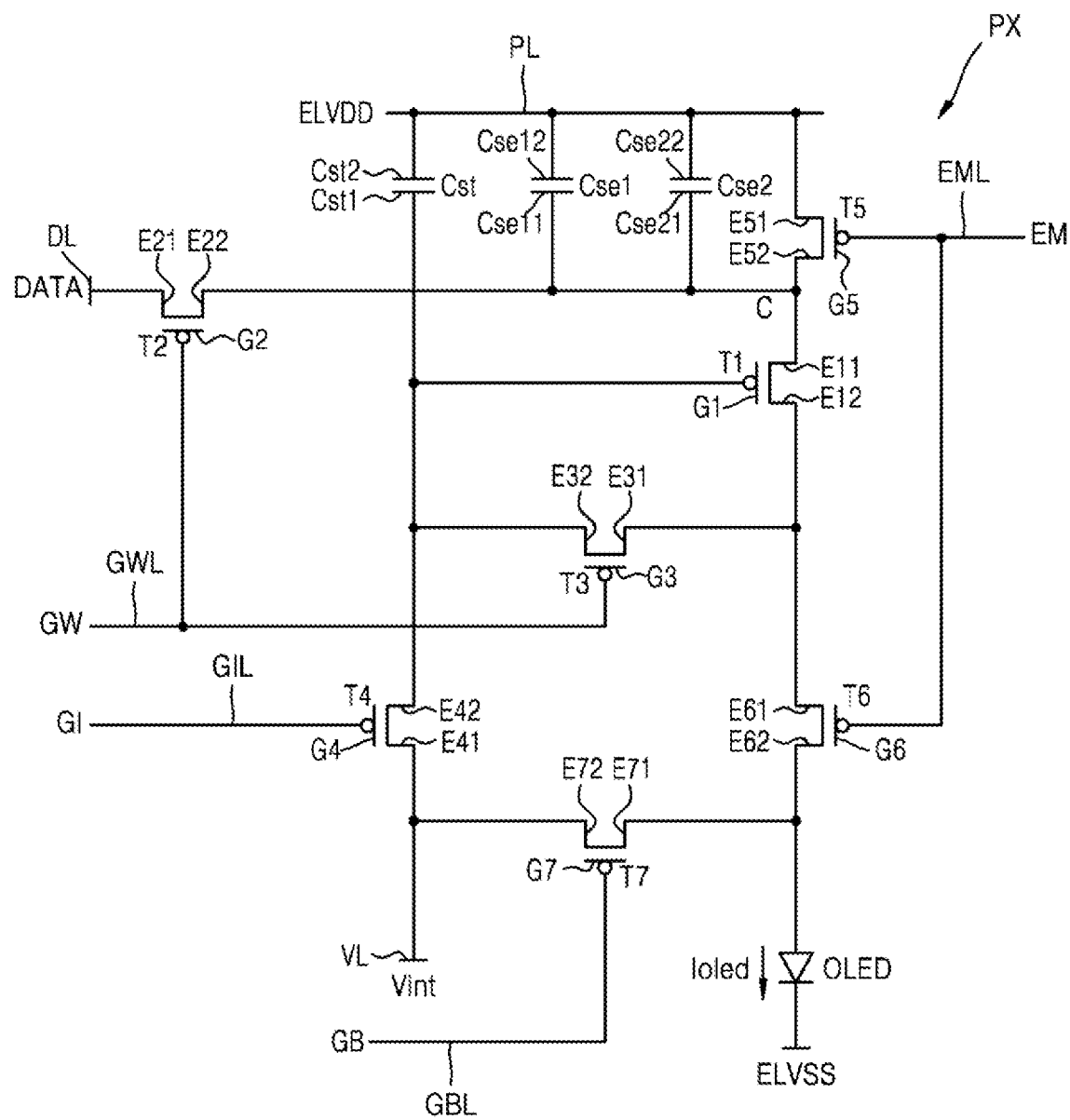
FIG. 2 is an equivalent circuit diagram of a representative pixel of the display device of FIG. 1, constructed according to an exemplary embodiment.

FIG. 2 is an equivalent circuit diagram of a representative pixel of the display device 1 of FIG. 1, constructed according to an exemplary embodiment.

The pixel PX includes a light-emitting device that emits light and a pixel circuit that receives signals from a plurality of wirings and drives the light-emitting device. Hereinafter, a pixel PX having an organic light-emitting device OLED as a light-emitting device will be described as an example, but the principles of the invention may be applied to other types of light emitting devices as will be recognized by the skilled artisan.

The wirings may include a first scan line GIL for transmitting a first scan signal GI, a second scan line GWL for transmitting a second scan signal GW, a third scan line GBL for transmitting a third scan signal GB, a data line DL for transmitting a data signal DATA, and a power line PL for transmitting a first power supply voltage ELVDD. The disclosure may further include, but is not limited to, an initialization line VL for transmitting an initialization voltage Vint and a light emission control line EML for transmitting a light emission control signal EM.

The pixel circuit of the pixel PX may include a plurality of transistors T1, T2, T3, T4, T5, T6, and T7 and capacitors Cst and Cse. First electrodes E11, E21, E31, E41, E51, E61, and E71 and second electrodes E12, E22, E32, E42, E52, E62, and E72 of FIG. 2 may be a source electrode (source region) or a drain electrode (drain region) depending on the type of transistor (p-type or n-type) and/or an operating condition.

The first transistor T1 includes a gate electrode G1 connected to a first electrode Cst1 of the storage capacitor Cst, the first electrode E11 connected to the power line PL via the fifth transistor T5, and the second electrode E12 electrically connected to a pixel electrode of the organic light-emitting device OLED via the sixth transistor T6. The first transistor T1 serves as a driving transistor and receives the data signal DATA according to a switching operation of the second transistor T2 to supply a current to the organic light-emitting device OLED.

The second transistor T2 includes a gate electrode G2 connected to the second scan line GWL, a first electrode E21 connected to the data line DL, and a second electrode E22 connected to the first electrode E11 of the first transistor T1. The second transistor T2 is turned on in response to the second scan signal GW received through the second scan line GWL and performs a switching operation to transmit the data signal DATA transmitted to the data line DL to the first electrode E11 of the first transistor T1.

The third transistor T3 includes a gate electrode G3 connected to the second scan line GWL, the first electrode E31 connected to the second electrode E12 of the first transistor T1, and the second electrode E32 connected to the second electrode E42 of the fourth transistor T4, the first electrode Cst1 of the storage capacitor Cst, and the gate electrode G1 of the first transistor T1. The third transistor T3 is turned on in response to the second scan signal GW received through the second scan line GWL to diode-connect the first transistor T1.

The fourth transistor T4 includes a gate electrode G4 connected to the first scan line GTL, the first electrode E41 connected to the initialization line VL, and the second electrode E42 connected to the second electrode E32 of the transistor T3, the first electrode Cst1 of the storage capacitor Cst, and the gate electrode G1 of the first transistor T1. The fourth transistor T4 is turned on in response to the first scan signal GI received through the first scan line GTL to transmit the initialization voltage Vint to the gate electrode G1 of the first transistor T1 and initializes a gate voltage of the first transistor T1.

The fifth transistor T5 includes a gate electrode G5 connected to the emission control line EML, the first electrode E51 connected to the power line PL, and the second electrode E52 connected to the first electrode E11 of the first transistor T1 and the second electrode E22 of the second transistor T2.

The sixth transistor T6 includes a gate electrode G6 connected to the emission control line EML, the first electrode E61 connected to the second electrode E12 of the first transistor T1 and the first electrode E31 of the third transistor T3, and the second electrode E62 connected to the pixel electrode of the organic light-emitting device OLED.

The fifth transistor T5 and the sixth transistor T6 are simultaneously turned on in response to the light emission control signal EM received through the light emission control line EML so that a current flows to the organic light-emitting device OLED.

The seventh transistor T7 includes a gate electrode G7 connected to the third scan line GBL, the first electrode E71 connected to the second electrode E62 of the sixth transistor T6 and the pixel electrode of the organic light-emitting device OLED, and the second electrode E72 connected to the initialization line VL. The seventh transistor T7 is turned on in response to the third scan signal GB received through the third scan line GBL to transmit the initialization voltage Vint to the pixel electrode of the organic light-emitting device OLED and initializes a voltage of the pixel electrode of the organic light-emitting device OLED.

The third scan line GBL connected to the gate electrode G7 of the seventh transistor T7 may be the first scan line GIL or the second scan line GWL of the next row or the previous row, and the third scan signal GB may be the first scanning signal GI or the second scanning signal GW of the next row or the previous row. The seventh transistor T7 may be omitted.

The storage capacitor Cst includes the first electrode Cst1 connected to the gate electrode G1 of the first transistor T1 and a second electrode Cst2 connected to the power line PL. The first electrode Cst1 of the storage capacitor Cst is also connected to the second electrode E32 of the third transistor T3 and the second electrode E42 of the fourth transistor T4.

A first compensation capacitor Cse1 includes a first electrode Cse11 connected to the first electrode E11 of the first transistor T1 and a second electrode Cse12 connected to the power line PL. The first electrode Cse11 of the first compensation capacitor Cse1 is also connected to the second electrode E22 of the second transistor T2 and the second electrode E52 of the fifth transistor T5.

A second compensation capacitor Cse2 is connected in parallel with the first compensation capacitor Cse1. The second compensation capacitor Cse2 includes a first electrode Cse21 connected to the first electrode E11 of the first transistor T1 and a second electrode Cse22 connected to the power line PL. The first electrode Cse21 of the second compensation capacitor Cse2 is also connected to the second electrode E22 of the second transistor T2 and the second electrode E52 of the fifth transistor T5.

The organic light-emitting device OLED includes a pixel electrode and a common electrode facing the pixel electrode, and the common electrode may receive a second power supply voltage ELVSS.

An intermediate layer is between the pixel electrode and the common electrode of the organic light-emitting device OLED. The intermediate layer includes an organic emission layer emitting light and in addition, may further include at least one of a hole injection layer (HIL), a hole transport layer (HTL), an electron transport layer (ETL), and an electron injection layer (EIL). However, the illustrated embodiment is not limited thereto and various functional layers may be between the pixel electrode and the common electrode.

The organic emission layer may emit red light, green light, or blue light. However, the disclosure is not limited thereto, and the organic emission layer may emit white light. In this case, the organic emission layer may include a structure in which a luminescent material emitting red light, a luminescent material emitting green light, and a luminescent material emitting blue light are stacked, or may include a structure in which a luminescent material emitting red light, a luminescent material emitting green light, and a luminescent material emitting blue light are mixed.

The organic light-emitting device OLED receives a driving current $I_{OLED}$ from the first transistor T1 and emits light of a predetermined color to display an image.

Figure 3:
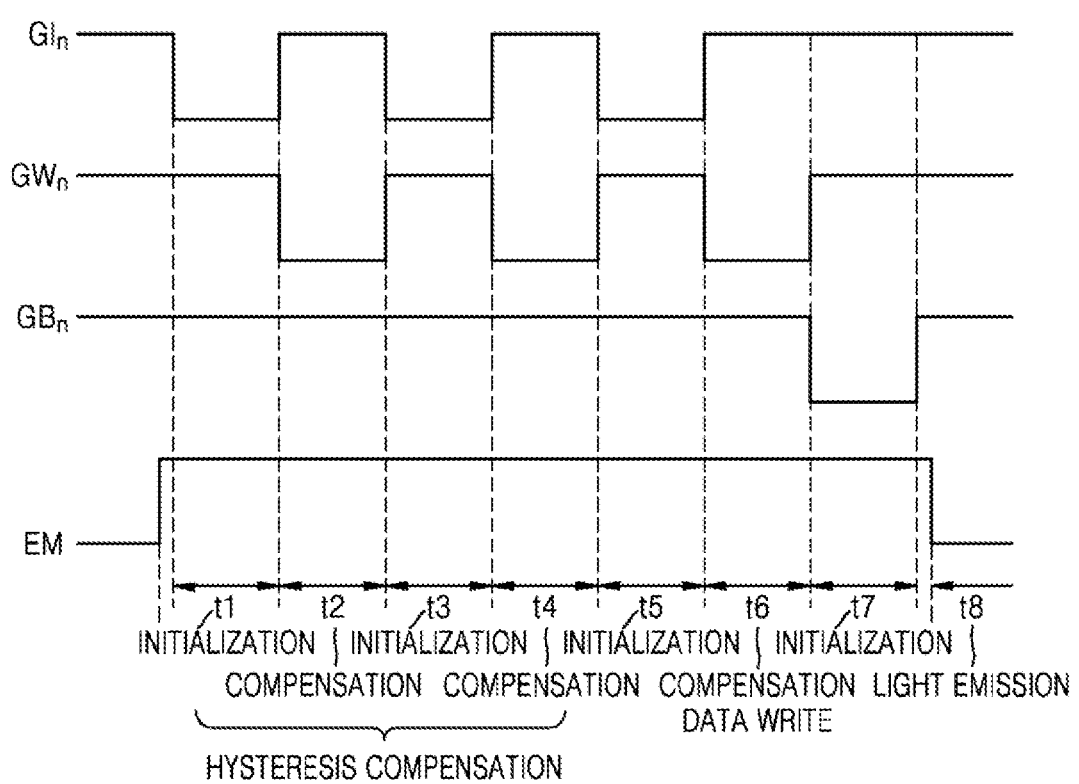
FIG. 3 is a timing diagram illustrating driving of the pixel of FIG. 2, according to an exemplary embodiment.

FIG. 3 is a timing diagram illustrating driving of the pixel of FIG. 2, according to an exemplary embodiment.

Referring to FIG. 3, the pixel PX performs hysteresis compensations from time periods t1 to t4, initialization in time period t5, threshold voltage compensation and data write in time period t6, and light emission in time period t8 for one frame. Initialization in time period t7 of a light-emitting device may be further performed before the light emission time period t8.

During the hysteresis compensations time periods t1 to t4, the initialization and the threshold voltage compensation are repeatedly performed on the pixel PX.

The first scan signal GI is supplied to the first scan line GIL in a first period t1 and a third period t3, and the initialization voltage Vint is supplied to the gate electrode G1 of the first transistor T1 through the fourth transistor T4 which is turned on in response to the first scan signal GI.

Also, the second scan signal GW is supplied to the second scan line GWL in a second period t2 and a fourth period t4, and the first transistor T1 is diode-connected by the third transistor T3, which is turned on in response to the second scan signal GW, to compensate for a threshold voltage of the first transistor T1.

An on bias voltage is applied to the gate electrode G1 of the first transistor T1 before a data signal is applied to the pixel PX during the first period to the fourth period t1 to t4, and hysteresis compensation of the first transistor T1 is performed.

Thereafter, the first scan signal GI is supplied to the first scan line GIL in a fifth period t5, and the initialization voltage Vint is supplied to the gate electrode G1 of the first transistor T1 through the fourth transistor T4 which is turned on in response to the first scan signal GI. The first compensation capacitor Cse prevents voltage drop of the first electrode E11 of the first transistor T1.

Then, the second scan signal GW is supplied to the second scan line GWL in a sixth period t6, and the second transistor T2 and the third transistor T3 are turned on. When the third transistor T3 is turned on, the first transistor T1 is diode-connected. When the first transistor T1 is diode-connected, a compensation voltage corresponding to the data signal DATA and the threshold voltage of the first transistor T1 is applied to the gate electrode G1 of the first transistor T1. Here, charges corresponding to a difference between the first power supply voltage ELVDD and the compensation voltage are stored in the storage capacitor Cst.

The third scan signal GB is supplied to the third scan line GBL in a seventh period t7, and the seventh transistor T7 is turned on. The initialization voltage Vint is supplied to the pixel electrode of the organic light-emitting device OLED through a seventh transistor T7.

The fifth transistor T5 and the sixth transistor T6 are turned on by the light emission control signal EM supplied from the light emission control line EML in an eighth period t8. Accordingly, the driving current $I_{OLED}$ according to a voltage difference between a voltage of the gate electrode G1 of the first transistor T1 and the first power supply voltage ELVDD is generated in the first transistor T1, and the driving current $I_{OLED}$ is supplied to the organic light-emitting device OLED through the sixth transistor T6.

The third scan signal GB is supplied to the third scan line GBL in the seventh period t7 in the exemplary embodiment of FIG. 3, but the disclosure is not limited thereto. The seventh period t7 overlaps at least one of the second period t2, the fourth period t4, and the sixth period t6 and the second scan signal GW may be supplied to the third scan line GBL.

Figure 4:
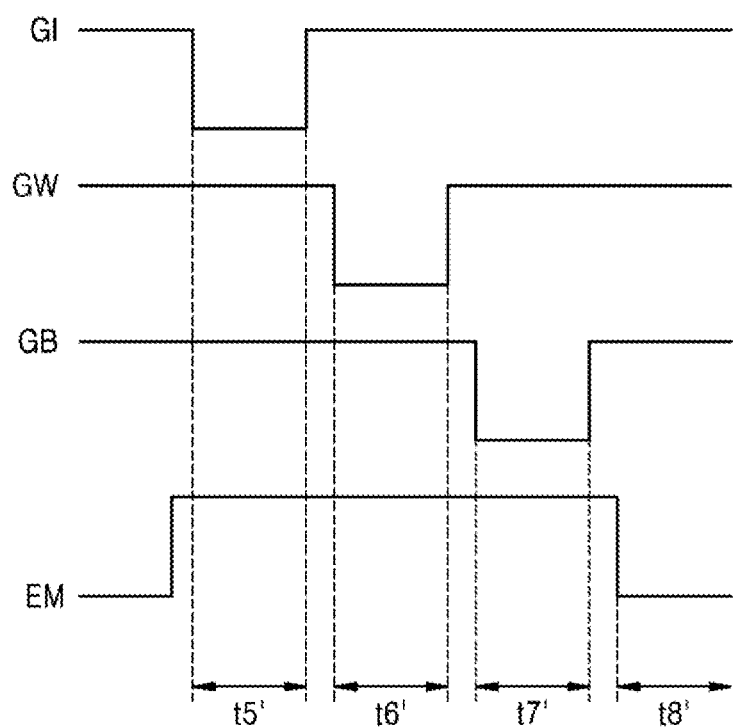
FIG. 4 is a timing diagram illustrating driving of the pixel of FIG. 2, according to a comparative example.
Figure 5:
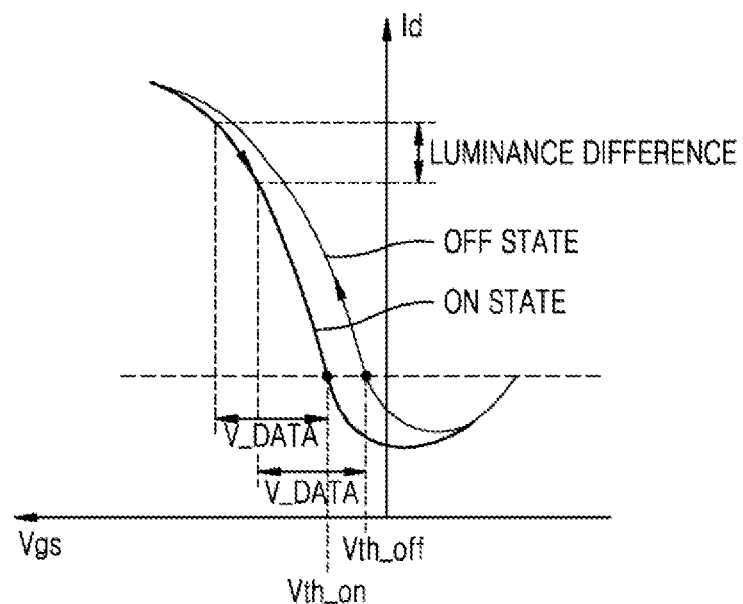
FIG. 5 is a graph illustrating a hysteresis characteristic of a thin-film transistor.

FIG. 4 is a timing diagram illustrating driving of the pixel of FIG. 2, according to a comparative example. FIG. 5 is a graph illustrating a hysteresis characteristic of a thin-film transistor, and FIG. 6 is a graph illustrating a luminance problem of a display device due to the hysteresis characteristic of the thin-film transistor.

When a display device displays an image, a color smear (afterimage) of predetermined color occurs, which is caused by a difference in between time points at which light is emitted by pixels emitting different colors (hereinafter referred to as 'color pixels') and a hysteresis characteristic of the thin-film transistor.

The pixel driving method according to the comparative example of FIG. 4 performs initialization t5' of the first transistor T1, threshold voltage compensation and data write t6', initialization t7' of a light-emitting device, and light emission t8' without the hysteresis compensations t1 to t4 of the pixel driving method according to the exemplary embodiment of FIG. 3.

Figure 6:
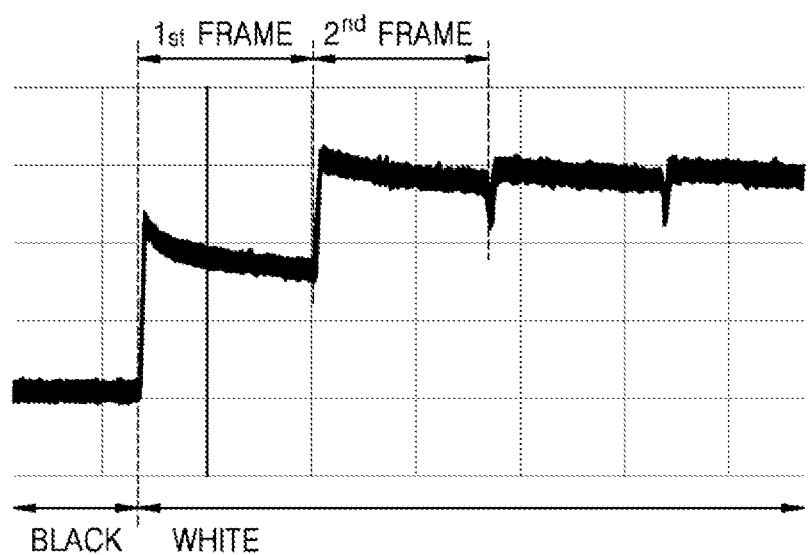
FIG. 6 is a graph illustrating a luminance problem of a display device due to a hysteresis characteristic of a thin-film transistor.

Referring to FIGS. 5 and 6, when the second scan signal GW is supplied to the second scan line GWL, a data signal is applied and a threshold voltage of the first transistor T1 is compensated. Here, due to the hysteresis characteristic of the thin-film transistor, the threshold voltage varies depending on whether the previous light emission state is an on state or an off state.

Accordingly, when the pixel changes from a black display to a white display, a luminance difference occurs between a white luminance of a first frame in which the first transistor T1 receives a data signal in the off state and a white luminance of a second frame in which the first transistor T1 receives a data signal in the on state.

In order to solve problems caused by the hysteresis characteristic of the thin-film transistor, the exemplary embodiment applies an arbitrary on bias voltage to the first transistor T1 a predetermined number of times before the threshold voltage compensation to shift the threshold voltage of the first transistor T1 in an identical direction and compensate for a hysteresis. A bias voltage Vgs means a difference (Vsource−Vgate=Vgs) between a voltage Vgate of the gate electrode G1 of the first transistor T1 and a voltage Vsource of the first electrode E11. The on bias voltage is a bias voltage that is greater than a threshold voltage Vth.

Turning to the timing diagram of FIG. 3, when the initialization voltage Vint is applied to the gate electrode G1 of the first transistor T1 in the fifth period t5, the voltage Vgate of the gate electrode G1 of the first transistor T1 is the difference between the voltage before initialization voltage application and the initial voltage Vint. The voltage of the gate electrode G1 of the first transistor T1 drops by a parasitic capacitor of the first transistor T1 and the voltage of the first electrode E11 of the first transistor T1 also drops. Here, a bias voltage of the first transistor T1 drops. Accordingly, an output current of the first transistor T1 may be reduced.

Therefore, the exemplary embodiment adds the first compensation capacitor Cse1 and the second compensation capacitor Cse2 for voltage stabilization between the power line PL of the pixel PX and the first electrode E11 of the first transistor T1. The first compensation capacitor Cse1 and the second compensation capacitor Cse2 may reduce voltage fluctuation in the first electrode E11 of the first transistor T1 so that the on bias voltage may be secured. The higher the on bias voltage, the greater the amount of light emitted by pixels, and deviation between the luminance of the first frame displaying white after displaying black and the luminance of the second frame may be reduced.

The illustrated embodiment discloses a parallel connection of the first compensation capacitor Cse1 and the second compensation capacitor Cse2, but is not limited thereto. The exemplary embodiments may include only one of the first compensation capacitor Cse1 and the second compensation capacitor Cse2. The illustrated embodiment in which the first compensation capacitor Cse1 and the second compensation capacitor Cse2 are connected to each other in parallel may increase the compensation capacitor capacity to further enhance an afterimage improvement effect compared with an exemplary embodiment including only one compensation capacitor.

Figure 7:
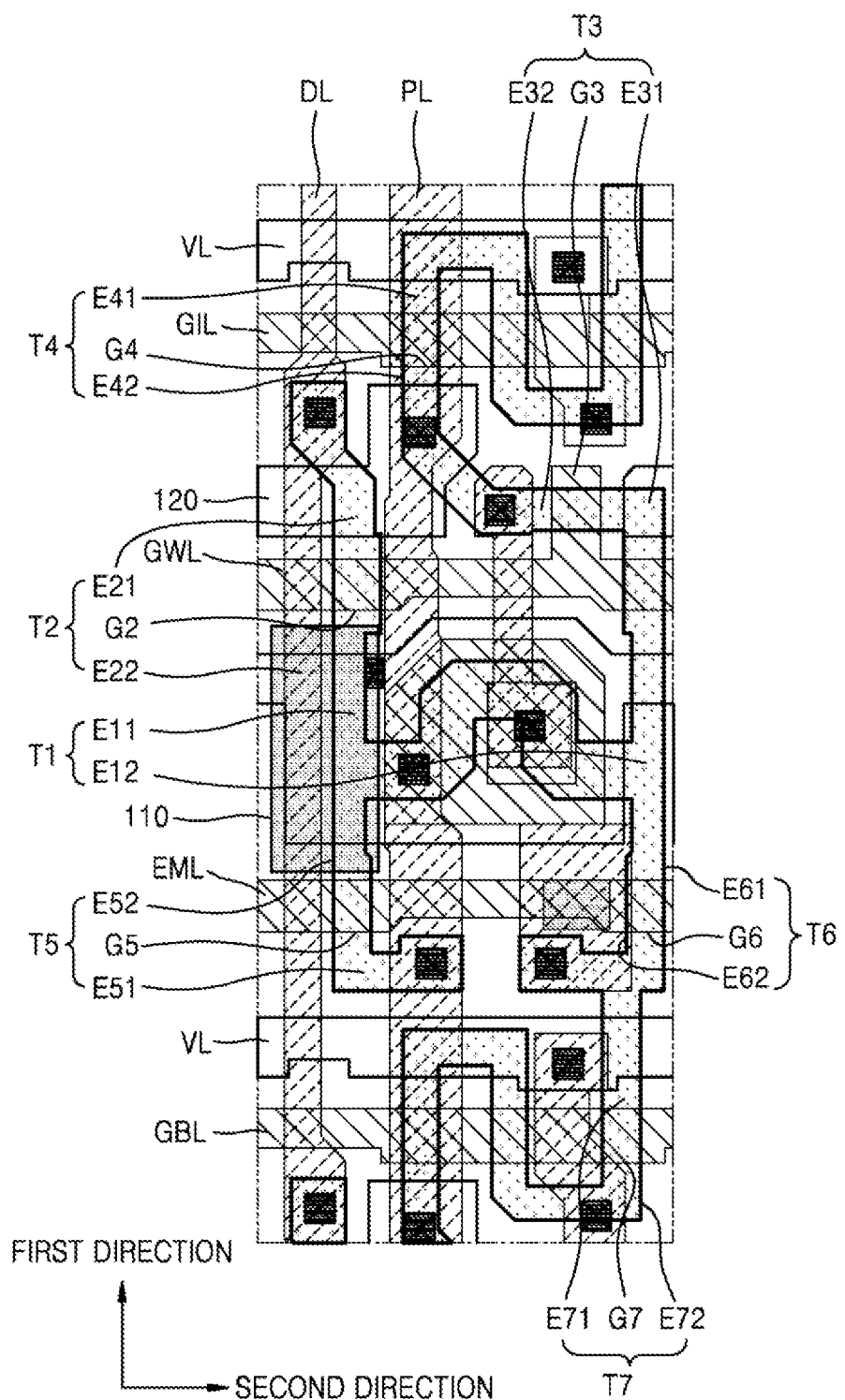
FIG. 7 is a plan view of a pixel circuit of the pixel shown in FIG. 2, constructed according to an exemplary embodiment.
Figure 8:
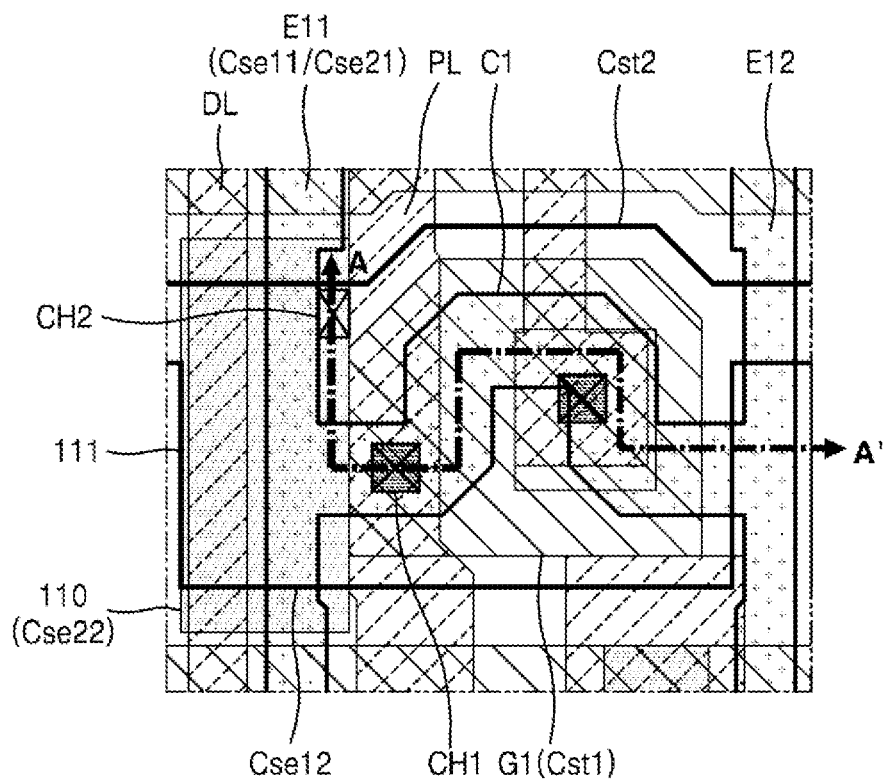
FIG. 8 is an enlarged plan view of a first transistor, a storage capacitor, and compensation capacitors of FIG. 7.
Figure 9:
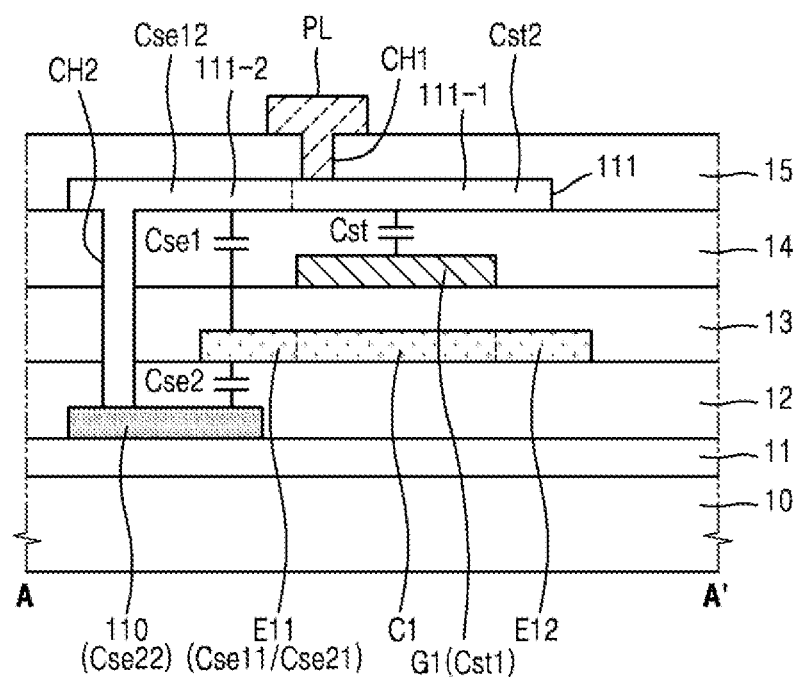
FIG. 9 is a cross-sectional view taken along line A-A' of FIG. 8.

FIG. 7 is a plan view of a pixel circuit of the pixel shown in FIG. 2, constructed according to an exemplary embodiment. FIG. 8 is an enlarged plan view of the first transistor T1, the storage capacitor Cst, and the compensation capacitors Cse1 and Cse2 of FIG. 7. FIG. 9 is a cross-sectional view taken along line A-A' of FIG. 8.

The pixel PX is arranged at a point where a plurality of wires extending in a first direction and a plurality of wires extending in a second direction intersecting the first direction cross each other. The first scan line GTL, the second scan line GWL, the third scan line GBL, the initialization line VL, and the light emission control line EML extend in the second direction. The data line DL and the power line PL extend in the first direction.

Each of the first to seventh transistors T1 to T7 includes a semiconductor layer including a source region, a drain region, and a channel region between the source region and the drain region, and a gate electrode arranged to be insulated from the semiconductor layer at a position corresponding to the channel region. The source region may be one of the first electrode and the second electrode shown in FIG. 2, and the drain region may be the other one of the first electrode and the second electrode. Hereinafter, for convenience of description, the source region and the drain region are referred to as the first electrode and the second electrode.

The semiconductor layer may be formed on the first insulating layer 12 on the substrate 10.

The substrate 10 may be a flexible substrate. The substrate 10 may be a plastic substrate. The substrate 10 may be formed as a stacked structure of an organic layer and an inorganic layer. For example, the substrate 10 may be a stacked structure of organic layer/inorganic layer/organic layer/inorganic layer. The inorganic layer, which is an uppermost layer of the substrate 10, may be a barrier layer.

The semiconductor layer is made of, for example, polysilicon and includes the channel region which is not doped with impurities, and the first electrode and the second electrode which are doped with impurities. The impurities may vary depending on the type of transistor and may include n-type impurities or p-type impurities. Semiconductor layers of the first to seventh transistors T1 to T7 may be arranged on an identical layer and may be bent into various shapes while being connected to each other.

A conductive layer 110 functioning as the second electrode Cse22 of the second compensation capacitor Cse2 may be arranged between the substrate 10 and the semiconductor layer. The conductive layer 110 may be arranged on the buffer layer 11 (see FIG. 9). The buffer layer 11 may be omitted.

A second insulating layer 13 (see FIG. 9) is arranged between the semiconductor layer and the gate electrode.

The first scan line GIL, the second scan line GWL, the third scan line GBL, and the light emission control line EML extend in the second direction over the same layer as that of the gate electrodes G1 to G7 of the first to seventh transistors T1 to T7. A third insulating layer 14 (see FIG. 9) is on the gate electrodes G1 to G7 of the first to seventh transistors T1 to T7.

The first transistor T1 includes a semiconductor layer including the first electrode E11, the second electrode E12, and a channel region C1, and the gate electrode G1. The gate electrode G1 of the first transistor T1 overlaps the channel region C1 in a plan view. The semiconductor layer of the first transistor T1 has a curve between the first electrode E11 and the second electrode E12 so that the channel region C1 may be formed long and a driving range of a gate voltage applied to the gate electrode G1 may be widened. The shape of the semiconductor layer A1 of the first transistor T1 may have various shapes such as a curved shape 'C', '⊐', 'S', 'M', 'W', and the like.

The second transistor T2 includes a semiconductor layer including the first electrode E21, the second electrode E22, and a channel region C2, and the gate electrode G2. The gate electrode G2 of the second transistor T2 overlaps the channel region C2 in a plan view. The first electrode E21 of the second transistor T2 is electrically connected to the data line DL through a contact hole of the second insulating layer 13 to a fourth insulating layer 15 (see FIG. 9). The second electrode E22 of the second transistor T2 is connected to the first electrode E11 of the first transistor T1.

The third transistor T3 includes a semiconductor layer including the first electrode E31, the second electrode E32, and a channel region C3, and the gate electrode G3. The gate electrode G3 of the third transistor T3 overlaps the channel region C3 in a plan view and is formed by a portion of the second scan line GWL. The first electrode E31 of the third transistor T3 is connected to the second electrode E12 of the first transistor T1 and the second electrode E32 is electrically connected to the gate electrode G1 of the first transistor T1 by a connection electrode. The connection electrode connects the second electrode E32 of the third transistor T3 to the gate electrode G1 of the first transistor T1 through the contact hole of the second insulating layer 13 to the fourth insulating layer 15 that expose the second electrode E32 of the third transistor T3 and the contact hole of the third insulating layer 14 and the fourth insulating layer 15 that expose the gate electrode G1 of the first transistor T1.

The fourth transistor T4 includes a semiconductor layer including the first electrode E41, the second electrode E42, and a channel region C4, and the gate electrode G4. The gate electrode G4 of the fourth transistor T4 overlaps the channel region C4 in a plan view and is formed by a portion of the first scan line GIL. The first electrode E41 of the fourth transistor T4 is electrically connected to the initialization line VL by the connection electrode and the second electrode E42 is electrically connected to the second electrode E32 of the third transistor T3 and the gate electrode G1 of the first transistor T1. The connection electrode connects the initialization line VL to the first electrode E41 of the fourth transistor T4 through the contact hole of the second insulating layer 13 to the fourth insulating layer 15 that expose the first electrode E41 of the fourth transistor T4 and the contact hole of the fourth insulating layer that exposes the initialization line VL. The initialization line VL is arranged over the same layer as that of the second electrode Cst2 of the storage capacitor Cst.

The fifth transistor T5 includes a semiconductor layer including the first electrode E51, the second electrode E52, and a channel region C5, and the gate electrode G5. The gate electrode G5 of the fifth transistor T5 overlaps the channel region C5 in a plan view and is formed by a portion of the light emission control line EML. The first electrode E51 of the fifth transistor T5 is electrically connected to the power line PL through the contact hole of the second insulating layer 13 to the fourth insulating layer 15 that expose a portion of the first electrode E51, and the second insulating layer 13 to the fourth insulating layer 15, and the second electrode E52 is connected to the first electrode E11 of the first transistor T1.

The sixth transistor T6 includes a semiconductor layer including the first electrode E61, the second electrode E62, and a channel region C6, and the gate electrode G6. The gate electrode G6 of the sixth transistor T6 overlaps the channel region C6 in a plan view and is formed by a portion of the light emission control line EML. The first electrode E61 of the sixth transistor T6 is connected to the second electrode E12 of the first transistor T1 and the second electrode E62 is electrically connected to a pixel electrode of the organic light-emitting device OLED. The second electrode E62 of the sixth transistor T6 is electrically connected to the connection electrode over the fourth insulation layer 15 through the contact hole of the second insulation layer 13 to the fourth insulation layer 15 that expose a portion of the second electrode E62. The pixel electrode is electrically connected to the second electrode E62 of the sixth transistor T6 by being electrically connected to the connection electrode through a via hole of the fifth insulation layer above the connection electrode connected to the second electrode E62 of the sixth transistor T6.

The seventh transistor T7 includes a semiconductor layer including the first electrode E71, the second electrode E72, and a channel region C7, and the gate electrode G7. The gate electrode G7 of the seventh transistor T7 overlaps the channel region C7 in a plan view and is formed by a portion of the third scan line GBL. The second electrode E72 of the seventh transistor T7 is connected to the first electrode E41 of the fourth transistor T4 and the first electrode E71 is connected to the second electrode E62 of the sixth transistor T6.

The first electrode Cst1 of the storage capacitor Cst is the gate electrode G1 of the first transistor T1. That is, it can be understood that the first electrode Cst1 of the storage capacitor Cst and the gate electrode G1 of the first transistor T1 are integral. The first electrode Cst1 of the storage capacitor Cst is formed in a square shape separated from adjacent pixels and is formed over the same layer as those of the first scan line GTL, the second scan line GWL, the third scan line GBL, and the light emission control line EML and is formed of the same material as those of the first scan line GIL, the second scan line GWL, the third scan line GBL, and the light emission control line EML.

The second electrode Cst2 of the storage capacitor Cst is connected to the second electrode Cst2 of pixels adjacent to each other in the second direction, that is, pixels in an identical row. The second electrode Cst2 of the storage capacitor Cst overlaps the first electrode Cst1 so as to cover the entire first electrode Cst1 and vertically overlaps the first transistor T1 according to a plan view and a cross-sectional view. The third insulating layer 14 between the first electrode Cst1 and the second electrode Cst2 of the storage capacitor Cst functions as a dielectric layer. The second electrode Cst2 of the storage capacitor Cst has an opening at a position corresponding to a contact hole that exposes a portion of the first electrode Cst1.

The fourth insulating layer 15 is over the second electrode Cst2 of the storage capacitor Cst. The data line DL and the power line PL extend in the first direction over the fourth insulating layer 15. The power line PL partially overlaps the second electrode Cst2 of the storage capacitor Cst.

The second electrode Cst2 of the storage capacitor Cst is electrically connected to the power line PL through a contact hole CH1 of the fourth insulating layer 15 that exposes a portion of the second electrode Cst2. Accordingly, the power line PL functions as a power line in the first direction and the second electrode Cst2 of the storage capacitor Cst functions as a power line in the second direction. Therefore, the power line PL may have a mesh structure as a whole. The power line PL is electrically connected to the first electrode E51 of the fifth transistor T5.

The first electrode Cse11 of the first compensation capacitor Cse1 is at least a portion of the first electrode E11 of the first transistor T1. That is, it can be understood that the first electrode Cse11 of the first compensation capacitor Cse1 and the first electrode E11 of the first transistor T1 are integral.

The second electrode Cse12 of the first compensation capacitor Cse1 is an electrode layer that extends from the second electrode Cst2 of the storage capacitor Cst and covers at least a portion of the first electrode E11 of the first transistor T1. That is, it can be understood that the second electrode Cse12 of the first compensation capacitor Cse1 and the second electrode Cst2 of the storage capacitor Cst are integral. Accordingly, the second electrode Cse12 of the first compensation capacitor Cse1 is electrically connected to the power line PL.

The first electrode Cse21 of the second compensation capacitor Cse2 is at least a portion of the first electrode E11 of the first transistor T1. That is, it can be understood that the first electrode Cse21 of the second compensation capacitor Cse2 and the first electrode E11 of the first transistor T1 are integral.

The second electrode Cse22 of the second compensation capacitor Cse2 is an electrode layer 110 arranged below the first electrode E11 of the first transistor T1 so as to overlap the first electrode E11 of the first transistor T1. The second electrode Cse22 of the second compensation capacitor Cse2 does not overlap the channel region C1 of the first transistor T1. The second electrode Cse22 of the second compensation capacitor Cse2 is electrically connected to the second electrode Cse12 of the first compensation capacitor Cse1 through a contact hole CH2 of the first insulation layer 12 to the third insulation layer 14. Accordingly, the second electrode Cse22 of the second compensation capacitor Cse2 is electrically connected to the power line PL.

The initialization line VL extends in the second direction over the same layer as that of the second electrode Cst2 of the storage capacitor Cst. The data line DL and the power line PL extend in the first direction over the fourth insulating layer 15 (see FIG. 9).

The pixel PX may include a light shielding member 120 covering a portion of at least one of the first electrode E21 and the second electrode E22 of the second transistor T2, and/or a portion of at least one of the first electrode E31 and the second electrode E32 of the third transistor T3, and/or a portion of at least one of the first electrode E41 and the second electrode E42 of the fourth transistor T4.

The light shielding member 120 may be over the same layer as that of the initialization line VL. The light shielding member 120 may include the same material as that of the initialization line VL. The light shielding member 120 may be electrically connected to the power line PL or the initialization line VL. The light shielding member 120 is connected to the power line PL or the initializing line VL and receives a constant voltage so that the second transistor T2, the third transistor T3, and the fourth transistor T4 may be prevented from being affected by other peripheral electrical signals. That is, the light shielding member 120 may improve an operation characteristic of a circuit of the pixel PX.

Referring to FIGS. 8 and 9, the first transistor T1 of the pixel PX includes a semiconductor layer including the first electrode E11, the second electrode E12, and the channel region C1, and the gate electrode G1 corresponding to the channel region C1. The storage capacitor Cst, the first compensation capacitor Cse1, and the second compensation capacitor Cse2 vertically overlap the first transistor T1 in a plan view and a cross-sectional view. The storage capacitor Cst includes the first electrode Cst1 as a lower electrode and the second electrode Cst2 as an upper electrode. The first compensation capacitor Cse1 includes the first electrode Cse11 as a lower electrode and the second electrode Cse12 as an upper electrode. The second compensation capacitor Cse2 includes the second electrode Cse22 as a lower electrode and the first electrode Cse21 as an upper electrode.

The electrode layer 110 overlaps at least the first electrode E11 of the first transistor T1. An electrode layer 111 includes at least a first region 111-1 overlapping at least the gate electrode G1 of the first transistor T1 and a second region 111-2 overlapping at least the first electrode E11 of the first transistor T1. A portion of the electrode layer 110 and the second region 111-2 of the electrode layer 111 overlap the data line DL.

The first region 111-1 of the electrode layer 111 serves as the second electrode Cst2 of the storage capacitor Cst. The second region 111-2 of the electrode layer 111 serves as the second electrode Cse12 of the first compensation capacitor Cse1. The electrode layer 111 is electrically connected to the power line PL through the contact hole CH1.

The storage capacitor Cst is formed by the first electrode Cst1 which is the gate electrode G1 of the first transistor T1 and the second electrode Cst2 which opposes the first electrode Cst1. The first compensation capacitor Cse1 is formed by the first electrode Cse11 which is the first electrode E11 of the first transistor T1 and the second electrode Cse12 which opposes the first electrode Cse11. The second electrode Cst2 of the storage capacitor Cst and the second electrode Cse12 of the first compensation capacitor Cse1 are electrically connected to the power line PL through the contact hole CH1 of the fourth insulating layer 15.

The first region 111-1 of the electrode layer 110 serves as the second electrode Cse22 of the second compensation capacitor Cse2. The electrode layer 110 is electrically connected to the power line PL through the contact hole CH2. The second compensation capacitor Cse2 is formed by the first electrode Cse21 which is the first electrode E11 of the first transistor T1 and the second electrode Cse22 which opposes the first electrode Cse21.

In the exemplary embodiments, the capacities of the first compensation capacitor Cse1 and the second compensation capacitor Cse2 are designed differently for each color pixel, and an on bias voltage for each color pixel may be set differently so that the amount of light emission for each color pixel may be adjusted. Accordingly, a difference between points in time at which light is emitted due to a deviation in output current per color pixel may be reduced. The capacities of the first compensation capacitor Cse1 and the second compensation capacitor Cse2 for each color pixel may be implemented by changing the amount of facing areas (overlapping areas) of electrodes.

Figure 10:
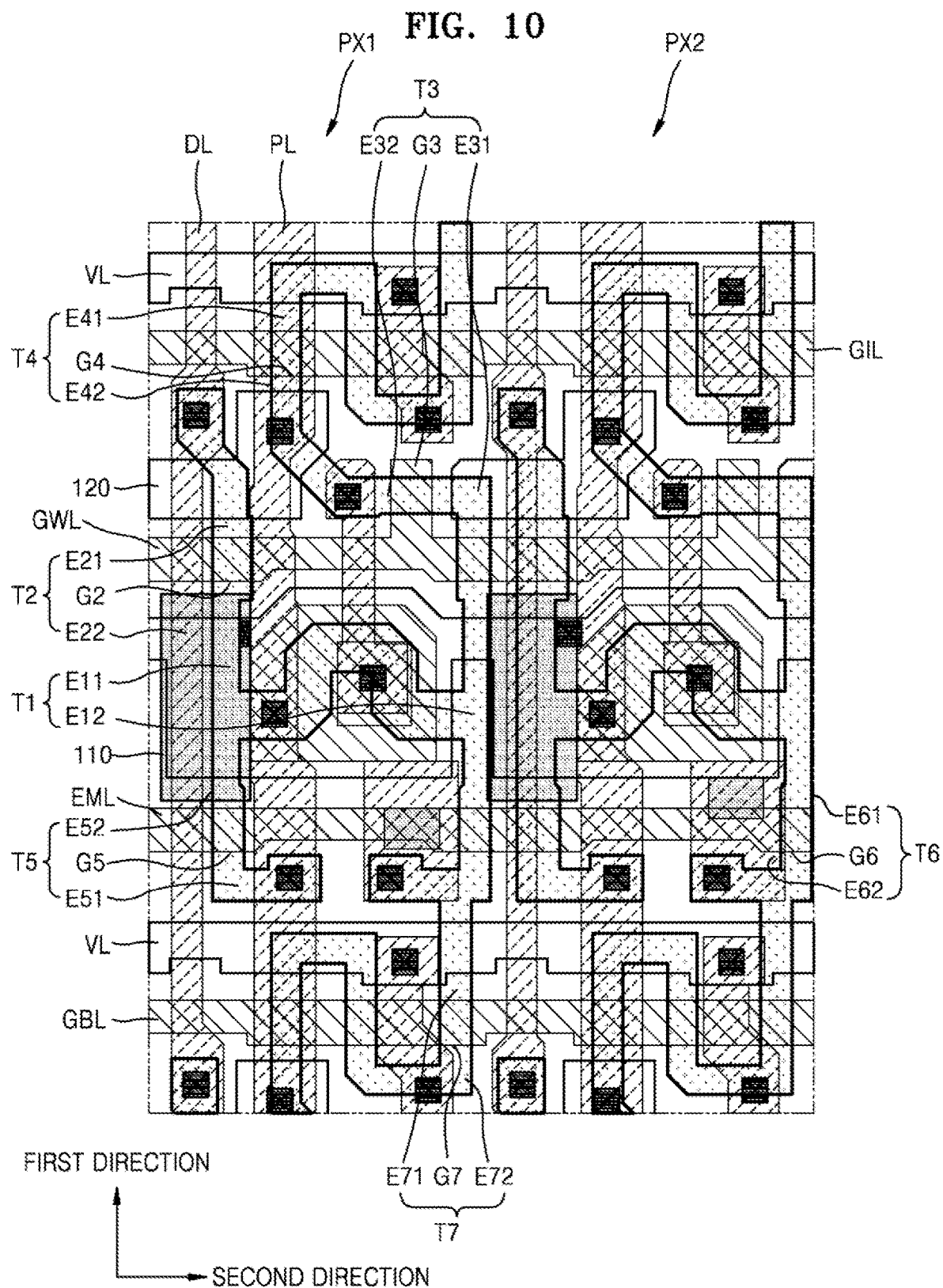
FIG. 10 is a plan view of a pixel circuit of different color pixels, constructed according to an exemplary embodiment.
Figure 11:
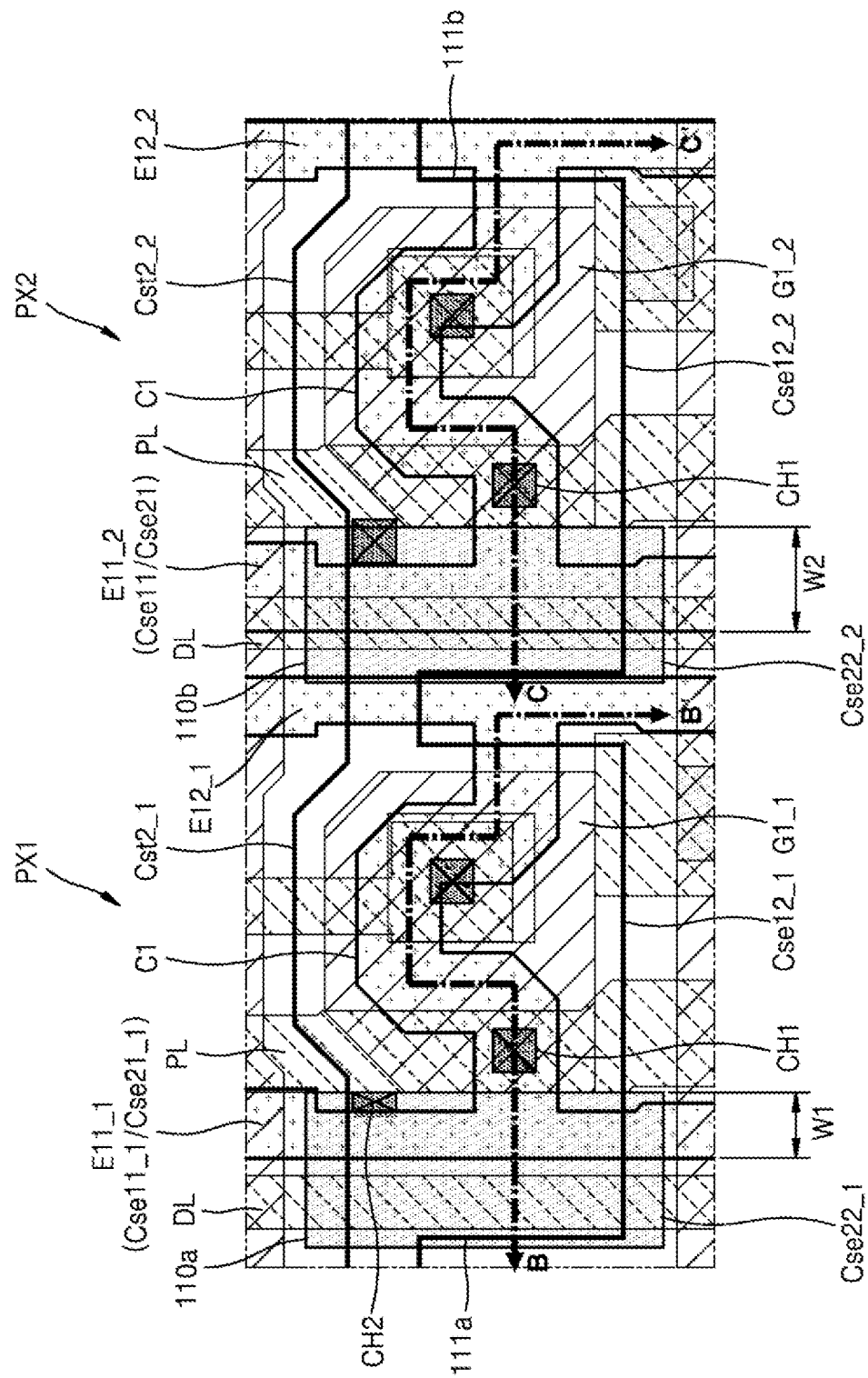
FIG. 11 is an enlarged plan view of a first transistor, a storage capacitor, and a compensation capacitor of FIG. 10.
Figure 12:
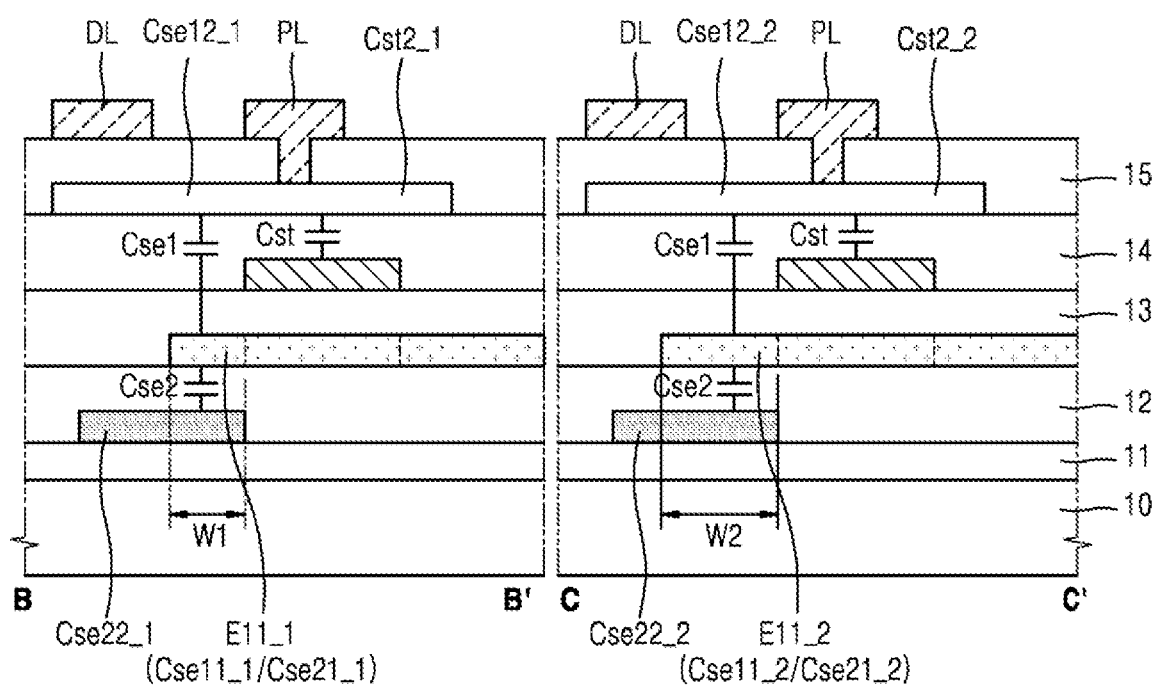
FIG. 12 is a cross-sectional view taken along line B-B' and line C-C' of FIG. 11.

FIG. 10 is a plan view of a pixel circuit of different color pixels constructed according to an exemplary embodiment. FIG. 11 is an enlarged plan view of the first transistor, the storage capacitor Cst, and the compensation capacitor Cse of FIG. 10. FIG. 12 is a cross-sectional view taken along line B-B' and line C-C' of FIG. 11. Hereinafter, a detailed description of the content overlapping those described with reference to FIGS. 7 to 9 will be omitted.

FIG. 10 shows an example in which a first pixel PX1 is arranged in a first pixel region of the substrate 10 and a second pixel PX2 is arranged in a second pixel region adjacent to the first pixel region. A third pixel PX3 may be arranged in a third pixel region adjacent to the second pixel region. The first pixel region to the third pixel region may be sequentially arranged along the second direction. Each of the first pixel PX1 to the third pixel PX3 includes a light-emitting device and a pixel circuit connected to the light-emitting device as shown in FIG. 2. In FIG. 10, for convenience of explanation, a pixel circuit of the first pixel PX1 is arranged in the first pixel region and a pixel circuit of the second pixel PX2 is arranged in the second pixel region.

In FIGS. 11 and 12, for convenience of explanation, different reference numerals are used to distinguish between the pixel circuit of the first pixel PX1 and the pixel circuit of the second pixel PX2.

Length and width (or area) of an electrode layer 110a of the first pixel PX1 are substantially the same as those of an electrode layer 110b of the second pixel PX2. Length and width (or area) of an electrode layer 111a of the first pixel PX1 are substantially the same as those of an electrode layer 111b of the second pixel PX2. Here, the length is in the first direction and the width is in the second direction.

A width W2 or an area of a first electrode E11_2 of the first transistor T1 of the second pixel PX2 is greater than a width W1 or an area of a first electrode E11_1 of the first transistor T1 of the first pixel PX1. Accordingly, a facing area of the first electrode E11_2 of the first transistor T1 of the second pixel PX2 and each of the electrode layer 110b and the electrode layer 111b is greater than a facing area of the first electrode E11_1 of the first transistor T1 of the first pixel PX1 and each of the electrode layer 110a and the electrode layer 111a. Therefore, the capacitance of the first compensation capacitor Cse1 of the second pixel PX2 is greater than capacitance of the first compensation capacitor Cse1 of the first pixel PX1, and capacitance of the second compensation capacitor Cse2 of the second pixel PX2 Cse2 is greater than capacity of the second compensation capacitor Cse2 of the first pixel PX1.

The illustrated embodiment may derive an on bias deviation between the first pixel PX1 and the second pixel PX2 by using capacitance differences between the first and second compensation capacitors Cse1 and Cse2 of the first pixel PX1 and the second pixel PX2 by adjusting a width or an area of the first electrode E11 of the first transistor T1 of the first pixel PX1 and the second pixel PX2. Accordingly, a strong on bias is applied to the second pixel PX2 rather than the first pixel PX1 to speed up a response rate, thereby reducing the difference in light emission delay between pixels.

The capacitances of the first and second compensation capacitors Cse1 and Cse2 of the third pixel PX3 in the third pixel region may be substantially the same as or different from the capacitances of the first and second compensation capacitors Cse1 and Cse2 of the first pixel PX1 or the capacitances of the first and second compensation capacitors Cse1 and Cse2 of the second pixel PX2. That is, the width or the area of the first electrode E11 of the first transistor T1 of the third pixel PX3 may be substantially the same as or different from the width or the area of the first electrode E11 of the first transistor T1 of the first pixel PX1 or the second pixel PX2. The facing area of the first electrode E11_1 of the first transistor T1 of the second pixel PX1 and each of the electrode layer (the first electrode layer) 110a and the electrode layer (the second electrode layer) 111a may be substantially the same as or different from the facing area of the first electrode of the first transistor of the third pixel PX3 and each of a first electrode layer and a second electrode layer of the third pixel PX3. The facing area of the first electrode E11_2 of the first transistor T1 of the second pixel PX2 and each of the electrode layer 110b and the electrode layer 111b may be substantially the same as or different from the facing area of the first electrode of the first transistor T1 of the third pixel PX3 and each of a first electrode layer and a second electrode layer of the third pixel PX3.

Figure 13:
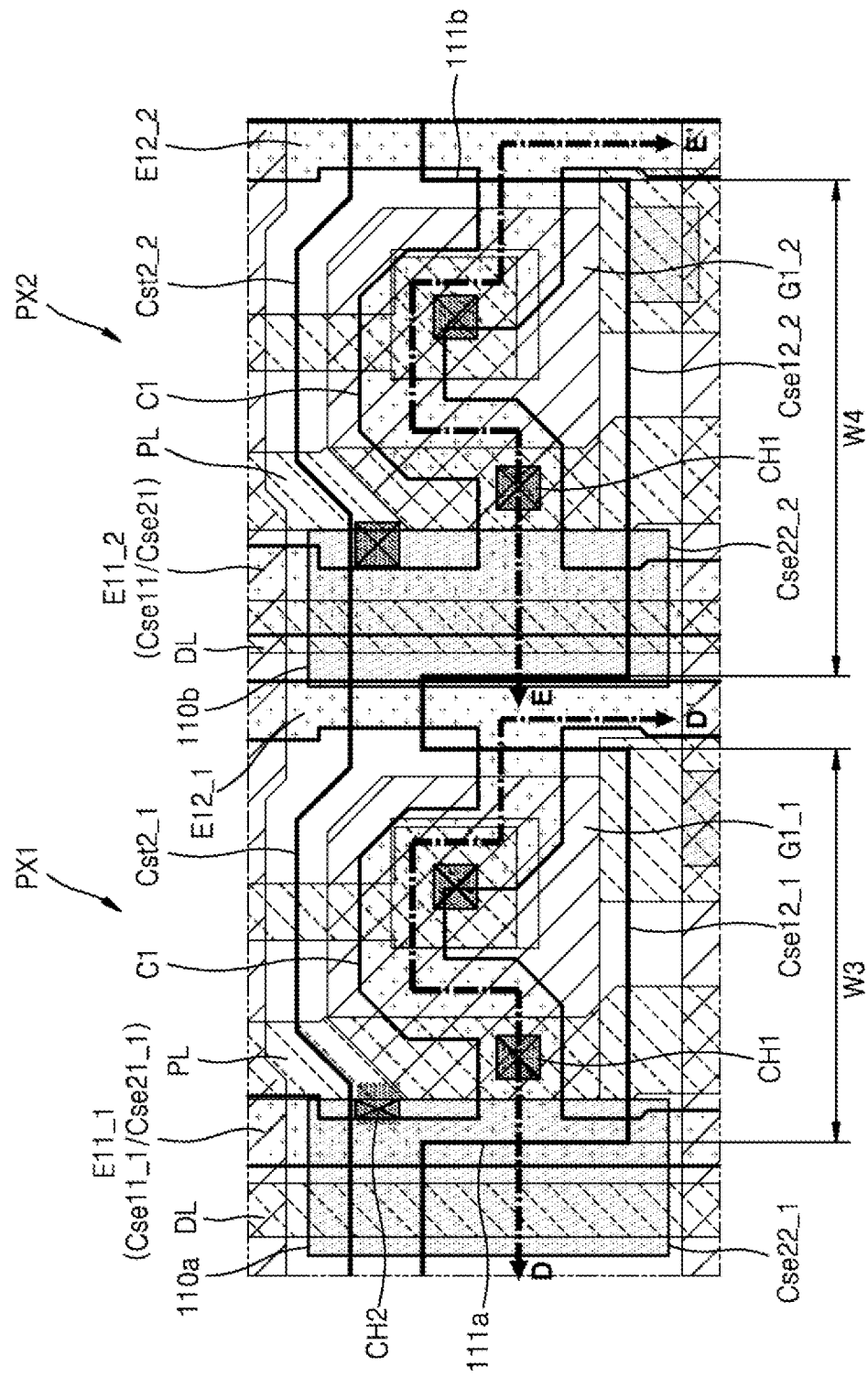
FIG. 13 is an enlarged plan view of a first transistor, a storage capacitor, and a compensation capacitor constructed according to another exemplary embodiment.
Figure 14:
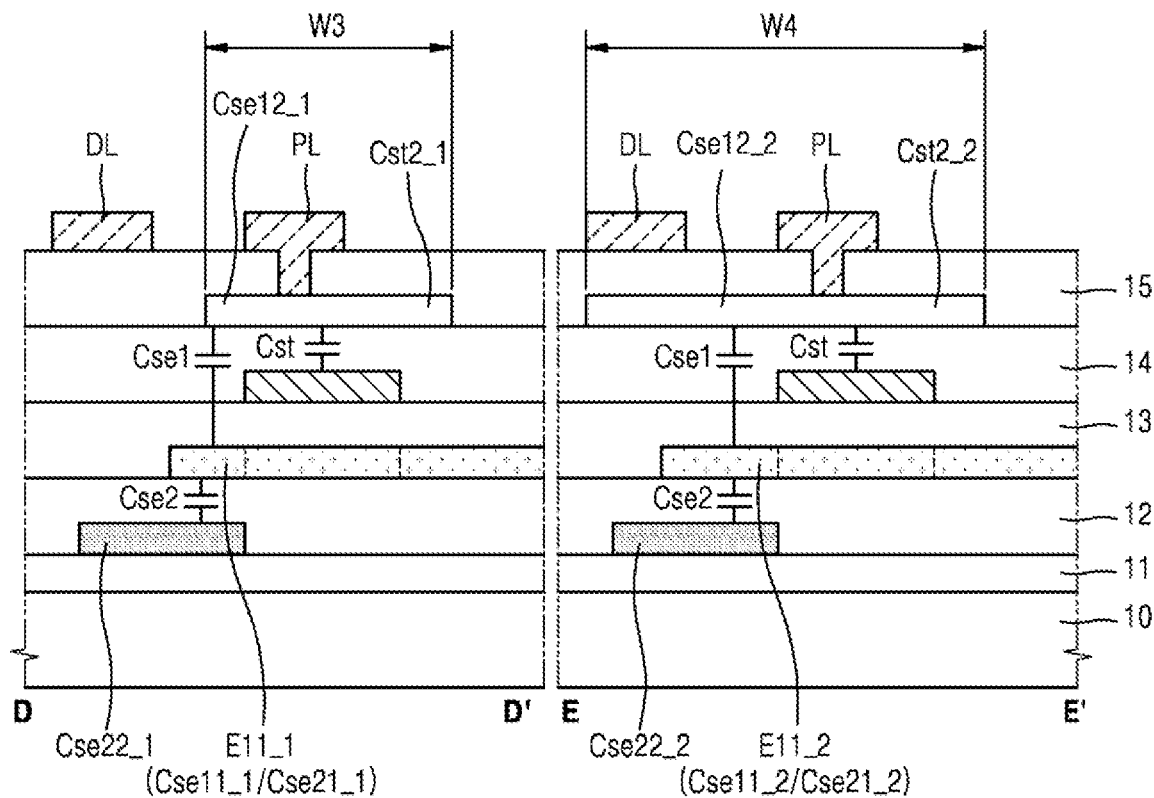
FIG. 14 is a cross-sectional view taken along line D-D' and line E-E' of FIG. 13.

FIG. 13 is an enlarged plan view of the first transistor T1, the storage capacitor Cst, and the compensation capacitor Cse constructed according to another exemplary embodiment. FIG. 14 is a cross-sectional view taken along line D-D' and line E-E' of FIG. 13. Hereinafter, different content from the above-described exemplary embodiments will be mainly described to avoid redundancy.

The exemplary embodiments shown in FIGS. 13 and 14 are different from the exemplary embodiments shown in FIGS. 11 and 12 in that the size (area) of the electrode layer 111a of the first pixel PX1 is different from the electrode layer 111b of the second pixel PX2.

A width W4 or an area of the electrode layer 111b of the second pixel PX2 is greater than a width W3 or an area of the electrode layer 111a of the first pixel PX1. The electrode layer 111b of the second pixel PX2 covers both a gate electrode G1_2 and the first electrode E11_2 of the first transistor T1 while the electrode layer 111a of the first pixel PX1 covers a portion of a gate electrode G1_1 of the first transistor T1 and the first electrode E11_1 of the first transistor T1. The width of the first electrode E11_2 of the first transistor T1 of the second pixel PX2 is greater than the width of the first electrode E11_1 of the first transistor T1 of the first pixel PX1. In another exemplary embodiment, the width of the first electrode E11_1 of the first transistor T1 of the first pixel PX1 is substantially the same as a width of the first electrode E11_2 of the first transistor T1 of the second pixel PX2.

Accordingly, the facing area of the first electrode E11_2 of the first transistor T1 of the second pixel PX2 and the electrode layer 111b is greater than the facing area of the first electrode E11_1 of the first transistor T1 of the first pixel PX1 and the electrode layer 111a. Therefore, capacitance of the first compensation capacitor Cse1 of the second pixel PX2 is greater than capacitance of the first compensation capacitor Cse1 of the first pixel PX1.

The illustrated embodiment may derive an on bias deviation between the first pixel PX1 and the second pixel PX2 by using a capacitance difference between the first and second compensation capacitors Cse1 of the first pixel PX1 and the second pixel PX2 by adjusting the width or the area of the second electrode Cse12 of the first compensation capacitor Cse1 of the first pixel PX1 and the second pixel PX2. Accordingly, a strong on bias is applied to the second pixel PX2 rather than the first pixel PX1 to speed up a response rate, thereby reducing a difference in light emission delay between pixels.

The capacitance of the first compensation capacitor Cse1 of the third pixel PX3 in the third pixel region may be substantially the same as or different from the capacitance of the first compensation capacitor Cse1 of the first pixel PX1 or the capacitance of the first compensation capacitor Cse1 of the second pixel PX2. That is, the width or the area of the second electrode Cse12 of the first compensation capacitor Cse1 of the third pixel PX3 may be substantially the same as or different from the width or the area of the second electrode Cse12 of the first compensation capacitor Cse1 of the first pixel PX1 or the second pixel PX2. The facing area of the first electrode E11_2 of the first transistor T1 of the second pixel PX2 and the electrode layer (the second electrode layer) 111b may be substantially the same as or different from the facing area of the first electrode of the first transistor of the third pixel PX3 and the second electrode layer of the third pixel PX3.

Figure 15:
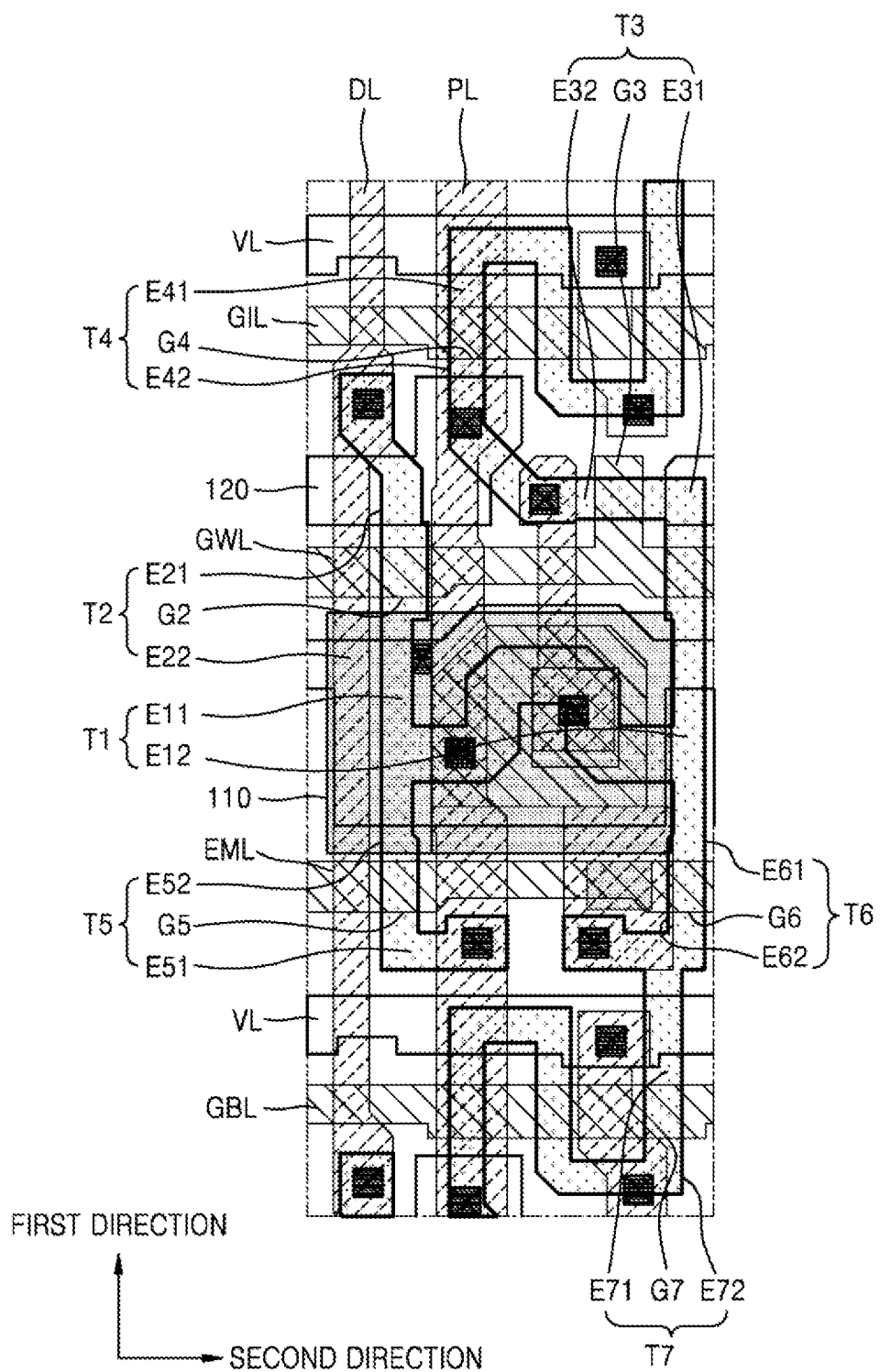
FIG. 15 is a plan view of a pixel circuit of the pixel shown in FIG. 2, constructed according to another exemplary embodiment.
Figure 16:
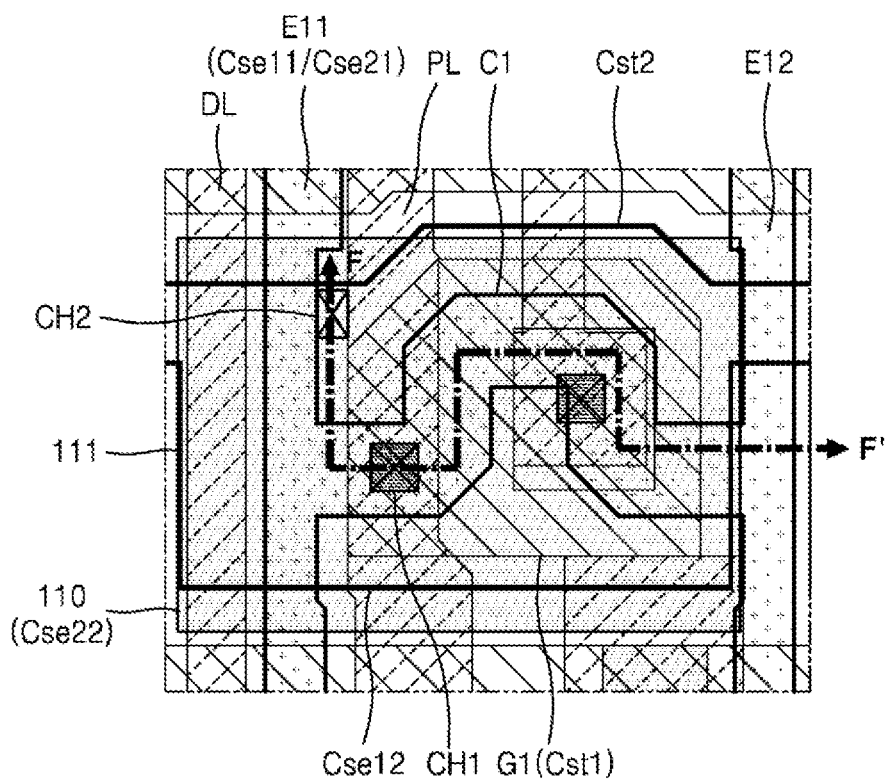
FIG. 16 is an enlarged plan view of a first transistor, a storage capacitor, and compensation capacitors of FIG. 15.
Figure 17:
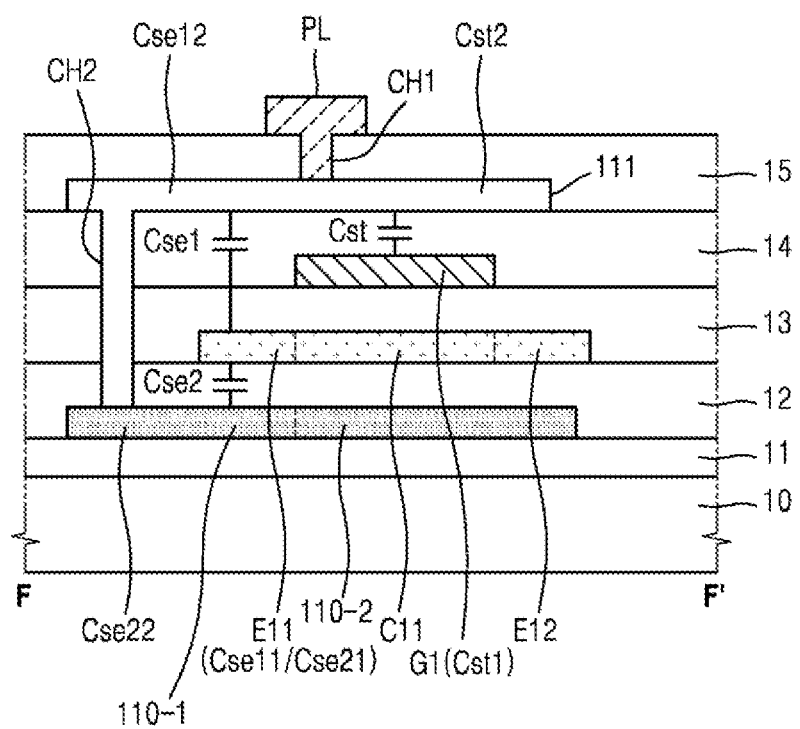
FIG. 17 is a cross-sectional view taken along line F-F' of FIG. 16.

FIG. 15 is a plan view of a pixel circuit of the pixel shown in FIG. 2, constructed according to another exemplary embodiment. FIG. 16 is an enlarged plan view of the first transistor T1, the storage capacitor Cst, and the compensation capacitors Cse1 and Cse2 of FIG. 15. FIG. 17 is a cross-sectional view taken along line F-F' of FIG. 16. Hereinafter, different content from the exemplary embodiments of FIGS. 7 to 9 will be mainly described to avoid redundancy.

The exemplary embodiment of FIGS. 15 to 17 is different from the exemplary embodiment of FIGS. 7 to 9 in that the electrode layer 110 of the pixel PX overlaps the first electrode E11 and the channel region C1 of the first transistor T1.

The electrode layer 110 includes a first region 110-1 overlapping at least the first electrode E11 of the first transistor T1 and a second region 110-2 extending from the first region 110-1 and overlapping the channel region C1 of the first transistor T1.

The first region 110-1 of the electrode layer 110 serves as the second electrode Cse22 of the second compensation capacitor Cse2. The second region 110-2 of the electrode layer 110 serves as a bottom gate electrode for controlling carrier movement of the channel region C1 together with the gate electrode G1 of the first transistor T1. An on bias voltage of the first transistor T1 may be further secured as the electrode layer 110 receives the first power supply voltage ELVDD.

Figure 18:
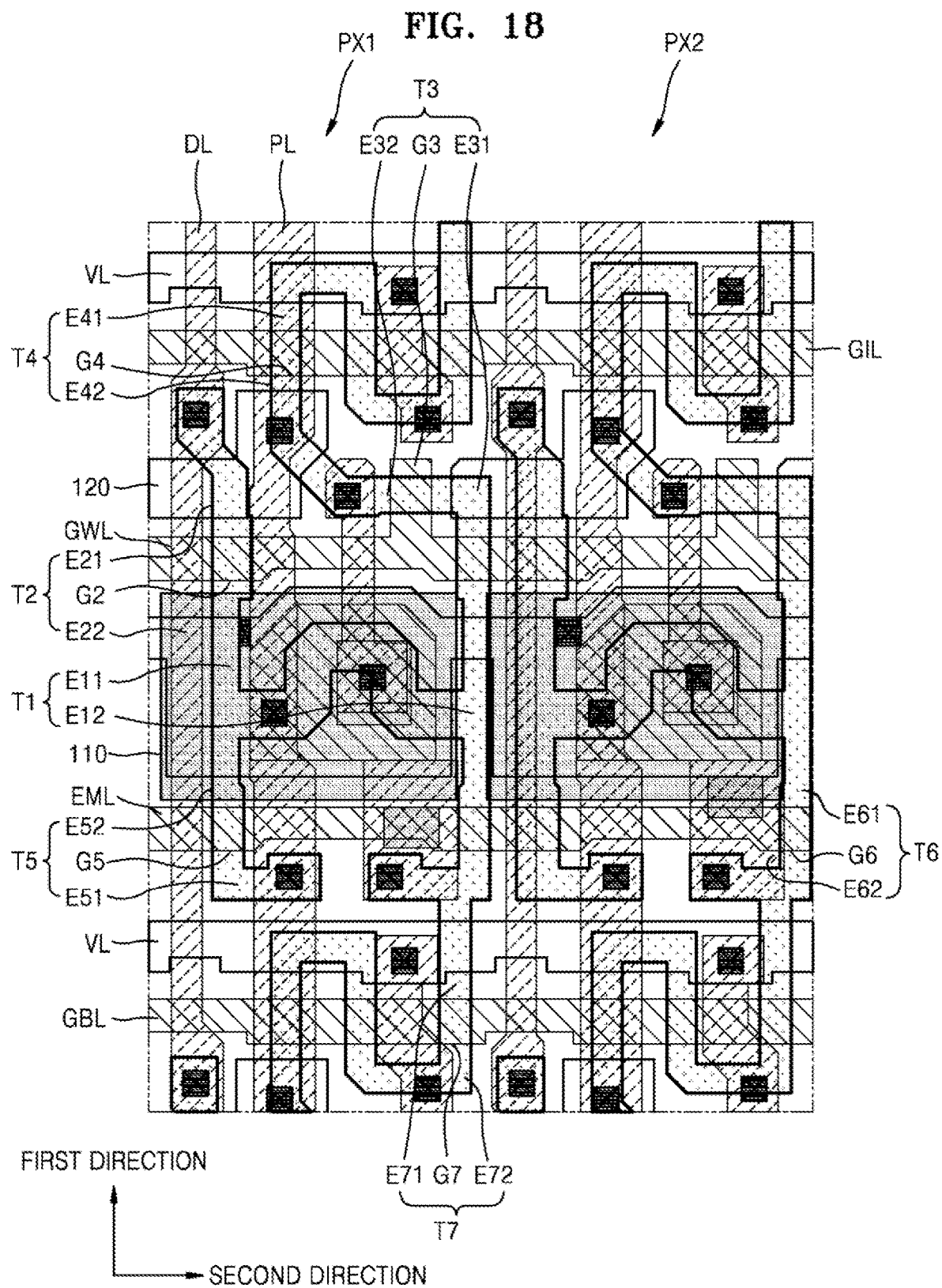
FIG. 18 is a plan view of a pixel circuit of different color pixels constructed according to another exemplary embodiment.
Figure 19:
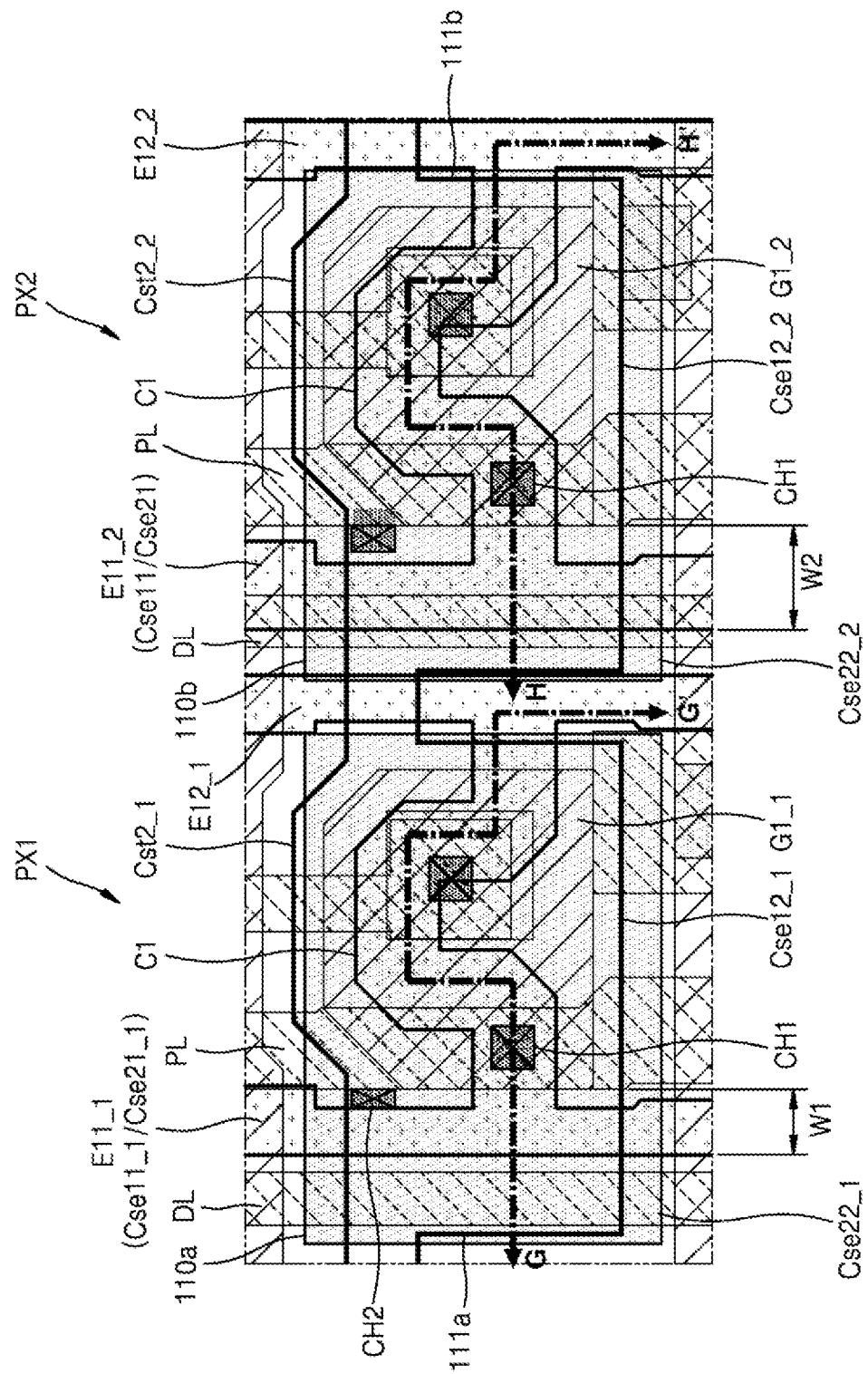
FIG. 19 is an enlarged plan view of a first transistor, a storage capacitor, and a compensation capacitor of FIG. 18.
Figure 20:
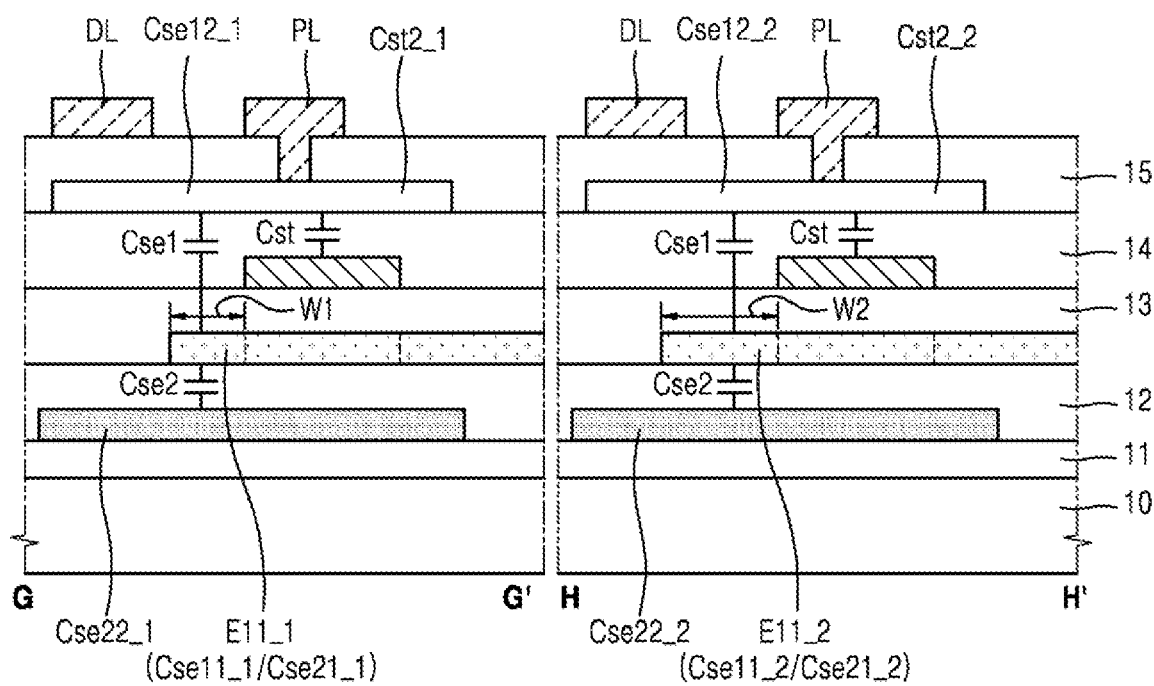
FIG. 20 is a cross-sectional view taken along line G-G' and line H-H' of FIG. 18.

FIG. 18 is a plan view of a pixel circuit of different color pixels constructed according to another exemplary embodiment. FIG. 19 is an enlarged plan view of the first transistor T1, the storage capacitor Cst, and the compensation capacitor Cse of FIG. 18. FIG. 20 is a cross-sectional view taken along line G-G' and line H-H' of FIG. 18.

The embodiment of FIGS. 18 to 20 is different from the embodiment of FIGS. 10 to 12 in that the electrode layer 110 of the pixel PX overlaps the first electrode E11 and the channel region C1 of the first transistor T1.

In the illustrated embodiment of FIGS. 18 to 20, the width W2 or the area of a first electrode E11_2 of the first transistor T1 of the second pixel PX2 is greater than the width W1 or the area of the first electrode E11_1 of the first transistor T1 of the first pixel PX1. That is, the illustrated embodiment may derive the on bias deviation between the first pixel PX1 and the second pixel PX2 by using the capacitance differences between the first and second compensation capacitors Cse1 and Cse2 of the first pixel PX1 and the second pixel PX2 by adjusting the width or the area of the first electrode E11 of the first transistor T1 of the first pixel PX1 and the second pixel PX2. Accordingly, a strong on bias is applied to the second pixel PX2 rather than the first pixel PX1 to speed up a response rate, thereby reducing a difference in light emission delay between pixels.

Furthermore, in the illustrated embodiment, the electrode layer 110 overlaps the first electrode E11 and the channel region C1 of the first transistor T1 so that a portion of the electrode layer 110 serves as the second electrode Cse22 of the second compensation capacitor Cse2 and the other portion serves as a bottom gate electrode for controlling carrier movement of the channel region C1. Accordingly, an on bias voltage of the first transistor T1 may be further secured because the electrode layer 110 receives the first power supply voltage ELVDD.

Figure 21:
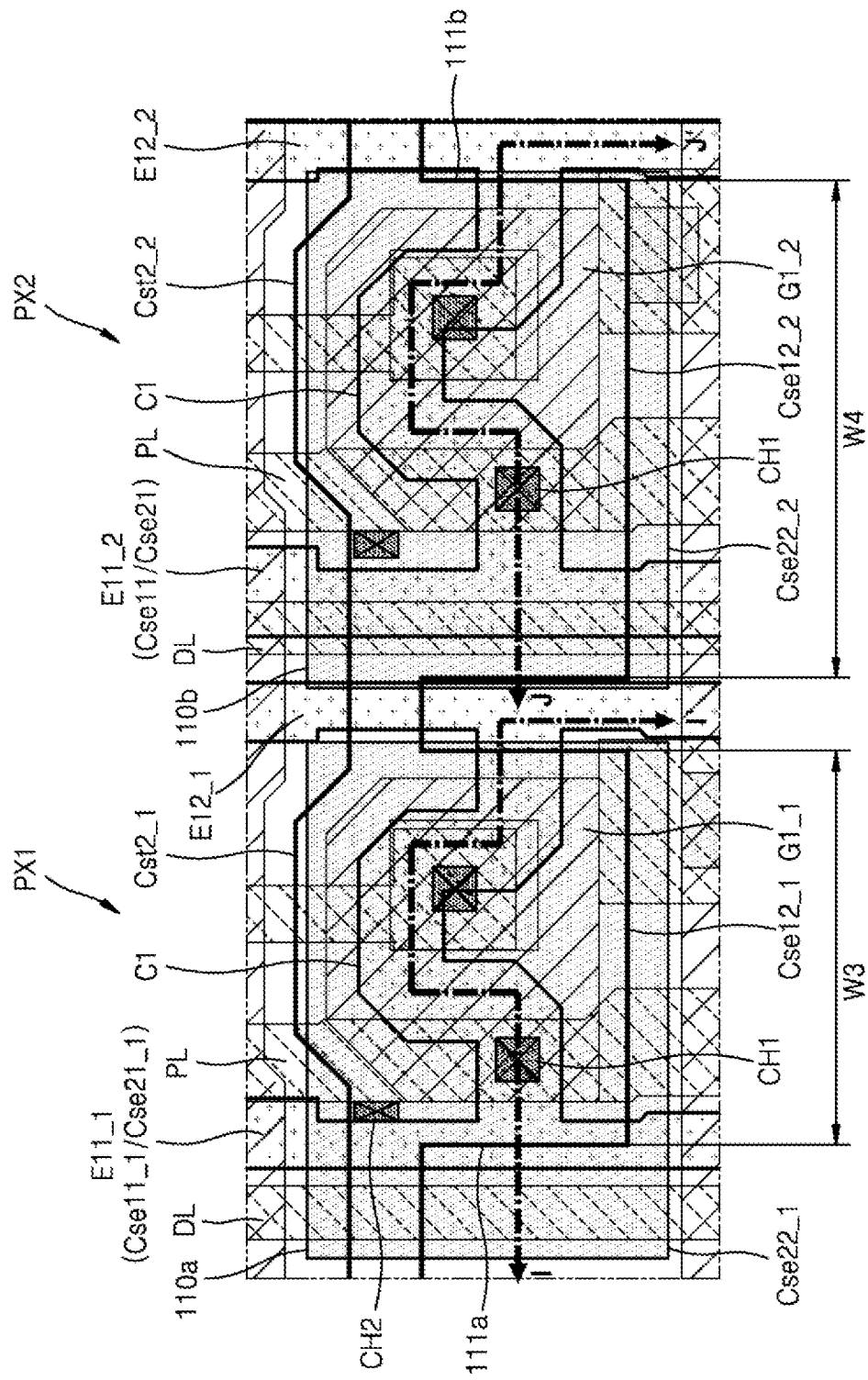
FIG. 21 is an enlarged plan view of a first transistor, a storage capacitor, and a compensation capacitor constructed according to another exemplary embodiment.
Figure 22:
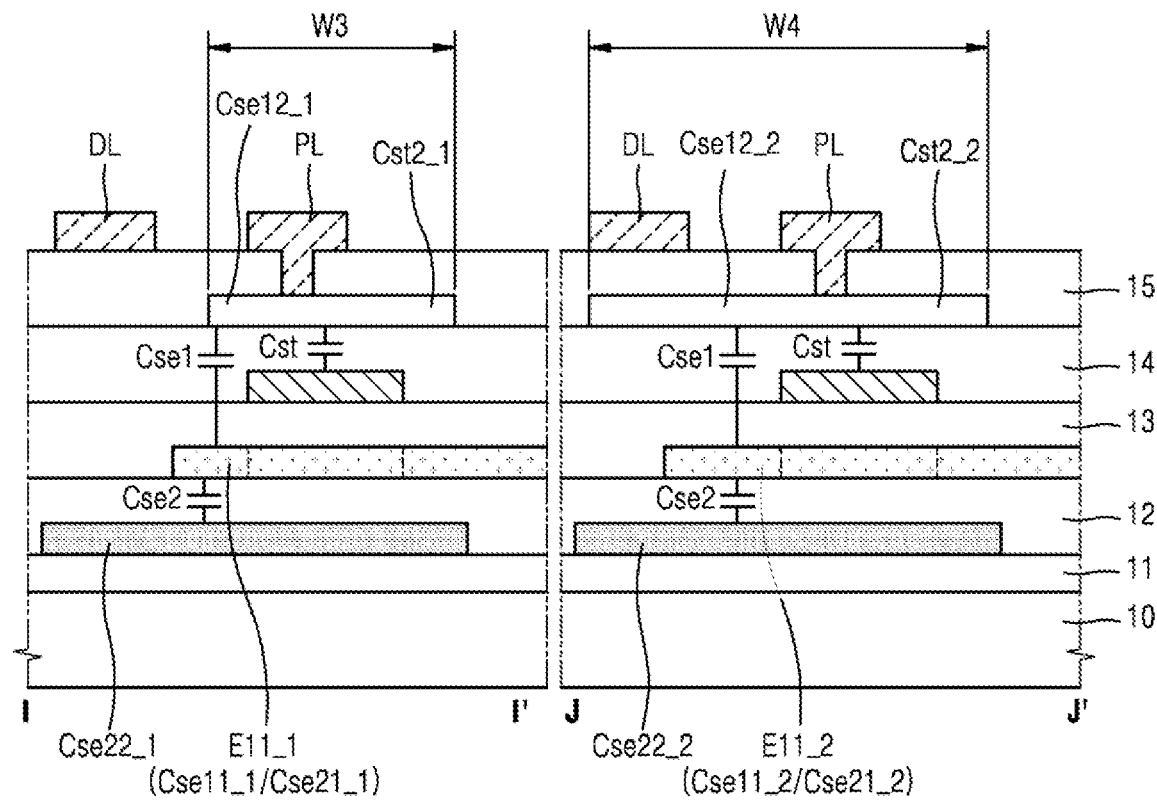
FIG. 22 is a cross-sectional view taken along line I-I' and line J-J' of FIG. 21.

FIG. 21 is an enlarged plan view of the first transistor T1, the storage capacitor Cst, and the compensation capacitor Cse according to another exemplary embodiment. FIG. 22 is a cross-sectional view taken along line I-I' and line J-J' of FIG. 21. Hereinafter, different content from the above-described exemplary embodiments will be mainly described to avoid redundancy.

The embodiments shown in FIGS. 21 and 22 are different from the embodiments shown in FIGS. 19 and 20 in that the size (area) of the electrode layer 111a of the first pixel PX1 is different from the electrode layer 111b of the second pixel PX2.

The width W4 or the area of the electrode layer 111b of the second pixel PX2 is greater than the width W3 or the area of the electrode layer 111a of the first pixel PX1. That is, the illustrated embodiment may derive the on bias deviation between the first pixel PX1 and the second pixel PX2 by using the capacitance difference between the first compensation capacitor Cse1 of the first pixel PX1 and the second pixel PX2 by adjusting the width or the area of the second electrode Cse12 of the first compensation capacitor Cse1 of the first pixel PX1 and the second pixel PX2. Accordingly, a strong on bias is applied to the second pixel PX2 rather than the first pixel PX1 to speed up a response rate, thereby reducing a difference in light emission delay between pixels.

And, the capacitances of the first and second compensation capacitors Cse1 and/or Cse2 of the third pixel PX3 in the third pixel region may be substantially the same as or different from the capacitances of the first and second compensation capacitors Cse1 and/or Cse2 of the first pixel PX1 or the capacitances of the first and second compensation capacitors Cse1 and/or Cse2 of the second pixel PX2. That is, the width or the area of the first electrode E11 of the first transistor T1 of the third pixel PX3 may be substantially the same as or different from the width or the area of the first electrode E11 of the first transistor T1 of the first pixel PX1 or the second pixel PX2. Or the width or the area of the second electrode Cse12 of the first compensation capacitor Cse1 of the third pixel PX3 may be substantially the same as or different from the width or the area of the second electrode Cse12 of the first compensation capacitor Cse1 of the first pixel PX1 or the second pixel PX2.

Furthermore, in the illustrated embodiment, the electrode layer 110 overlaps the first electrode E11 and the channel region C1 of the first transistor T1 so that a portion of the electrode layer 110 serves as the second electrode Cse22 of the second compensation capacitor Cse2 and the other portion serves as a bottom gate electrode for controlling carrier movement of the channel region C1. Accordingly, the on bias voltage of the first transistor T1 may be further secured because the electrode layer 110 receives the first power supply voltage ELVDD.

The display device according to the exemplary embodiments includes a compensation capacitor including a first electrode that is at least a portion of a source region or a drain region of a driving transistor and a second electrode connected to a power line which receives a first power supply voltage so that an on-bias voltage of the driving transistor may be increased. The on bias voltage of the driving transistor may be further increased by further providing a pair of parallel-connected compensation capacitors.

In addition, the display device according to the exemplary embodiments may differentiate the on bias voltage for each color pixel through capacity control by controlling areas (widths) of opposite electrodes of the compensation capacitors. Thus, the on bias voltage may be controlled for each color pixel to adjust the amount of light emission and a point in time of light emission for each color pixel. Therefore, the display device according to the exemplary embodiments may reduce a deviation of light emission delay between color pixels, thereby improving color smear and/or color blurring.

A display device according to the exemplary embodiments may reduce or prevent color smear phenomenon and provide a high quality image.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a bottom metal layer;
a semiconductor layer disposed on the bottom metal layer;
a first electrode layer disposed on the semiconductor layer;
a second electrode layer disposed on the first electrode layer and overlapping the first electrode layer;
a power line disposed on the second electrode layer and electrically connected to the bottom metal layer and the second electrode layer; and
a light-emitting device comprising a pixel electrode, a common electrode facing the pixel electrode, and an emission layer between the pixel electrode and the common electrode,
wherein a first end of the semiconductor layer is electrically connected to the power line and a second end of the semiconductor layer is electrically connected to the pixel electrode,
wherein the semiconductor layer comprises a source area, a drain area, and a channel area between the source area and the drain area,
wherein each of the bottom metal layer, the first electrode layer, the second electrode layer, and the power line overlaps the channel area of the semiconductor layer, and
wherein the channel area of the semiconductor layer is located between a connected part of the power line and the first end of the semiconductor layer and a connected part of the second end of the semiconductor layer and the pixel electrode.

2. The display device of claim 1, wherein the second electrode layer is between the first electrode layer and the power line and is electrically insulated from the first electrode layer.

3. The display device of claim 1, wherein the semiconductor layer comprises polysilicon.

4. The display device of claim 1, wherein the power line is configured to receive a substantially constant voltage.

5. The display device of claim 1, wherein the channel region of the semiconductor layer is curved.

6. The display device of claim 1, further comprising:
a first insulating layer disposed between the bottom metal layer and the semiconductor layer;
a second insulating layer disposed between the semiconductor layer and the first electrode layer;
a third insulating layer disposed between the first electrode layer and the second electrode layer; and
a fourth insulating layer disposed between the second electrode layer and the power line.

7. A display device comprising:
a substrate;
a driving transistor disposed on the substrate, the driving transistor comprising a semiconductor layer and a gate electrode;
a power line disposed on the driving transistor and electrically connected to the driving transistor;
a bottom metal layer arranged between the substrate and the semiconductor layer; and
an electrode layer overlapping the gate electrode of the driving transistor and electrically connected to the power line; and
a light-emitting device comprising a pixel electrode, a common electrode facing the pixel electrode, and an emission layer between the pixel electrode and the common electrode,
wherein the semiconductor layer overlaps the bottom metal layer,
wherein the power line and the bottom metal layer are configured to receive a same voltage,
wherein a first end of the semiconductor layer is electrically connected to the power line and a second end of the semiconductor layer is electrically connected to the pixel electrode,
wherein the semiconductor layer comprises a source area, a drain area, and a channel area between the source area and the drain area,
wherein each of the bottom metal layer, the gate electrode of the driving transistor, the electrode layer, and the power line overlaps the channel area of the semiconductor layer, and
wherein the channel area of the semiconductor layer is located between a connected part of the power line and the first end of the semiconductor layer and a connected part of the second end of the semiconductor layer and the pixel electrode.

8. The display device of claim 7, wherein the semiconductor layer comprises polysilicon.

9. The display device of claim 7, further comprising:
a first insulating layer disposed between the bottom metal layer and the semiconductor layer;
a second insulating layer disposed between the semiconductor layer and a first electrode layer;
a third insulating layer disposed between the first electrode layer and a second electrode layer; and
a fourth insulating layer disposed between the second electrode layer and the power line.

10. The display device of claim 7, further comprising:
a buffer layer disposed between the substrate and the bottom metal layer.

11. The display device of claim 7, wherein the substrate comprises an organic layer and an inorganic layer.

12. A display device comprising:
a substrate;
a bottom metal layer on the substrate;
a first transistor overlapping the bottom metal layer and comprising a first semiconductor layer and a first gate electrode;
an electrode layer overlapping the first gate electrode of the first transistor;
a power line disposed on the first transistor and electrically connected to the electrode layer;
a second transistor comprising a second semiconductor layer and a second gate electrode;
a connection electrode electrically connecting the first gate electrode of the first transistor and a first end of the second semiconductor layer; and a light-emitting device comprising a pixel electrode, a common electrode facing the pixel electrode, and an emission layer between the pixel electrode and the common electrode, wherein a first end of the first semiconductor layer is electrically connected to the power line and a second end of the first semiconductor layer is electrically connected to the pixel electrode, and wherein a second end of the second semiconductor layer is electrically connected to the second end of the first semiconductor layer.

13. The display device of claim 12, wherein the first semiconductor layer comprises a source area, a drain area, and a channel area between the source area and the drain area, and wherein each of the bottom metal layer, the first gate electrode, the electrode layer, and the power line overlaps the channel area of the first semiconductor layer.

14. The display device of claim 12, wherein the electrode layer is electrically insulated from the first gate electrode of the first transistor.

15. The display device of claim 12, wherein the first semiconductor layer comprises polysilicon.

16. The display device of claim 12, wherein the channel region of the semiconductor layer is curved.

17. The display device of claim 12, further comprising:
a buffer layer disposed between the substrate and the bottom metal layer.

18. The display device of claim 12, wherein the substrate comprises an organic layer and an inorganic layer.

19. The display device of claim 12, further comprising:
a data line disposed on a same layer as the power line.

20. The display device of claim 12, wherein a part of the power line and a part of the data line overlap the electrode layer.

* * * * *